United States Patent
Konishi et al.

(10) Patent No.: US 6,555,831 B1
(45) Date of Patent: Apr. 29, 2003

(54) ION IMPLANTING APPARATUS

(75) Inventors: Masashi Konishi, Kyoto (JP); Shuichi Maeno, Kyoto (JP); Yasunori Ando, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/559,728

(22) Filed: Apr. 28, 2000

(30) Foreign Application Priority Data

| Apr. 30, 1999 | (JP) | 11-123973 |
| Sep. 13, 1999 | (JP) | 11-258361 |
| Sep. 30, 1999 | (JP) | 11-278922 |

(51) Int. Cl.$^7$ .............................................. H01J 37/00
(52) U.S. Cl. ............................. 250/492.21; 250/492.3; 250/492.1; 315/111.81; 315/111.61; 313/359.1
(58) Field of Search .......................... 250/492.1, 492.2, 250/492.21, 492.22, 492.3; 313/361.1, 360.1, 359.1, 362.1; 315/111.01, 111.81, 111.61, 111.21

(56) References Cited

U.S. PATENT DOCUMENTS 6,184,532 B1 * 2/2001 Dudnikov et al. ...... 250/423 R

FOREIGN PATENT DOCUMENTS

| JP | 3-134937 | 6/1991 |
| JP | 3-182033 | 8/1991 |

* cited by examiner

Primary Examiner—John R. Lee
Assistant Examiner—David A Vanore
(74) Attorney, Agent, or Firm—Finnegan, Henderson, Farabow, Garrett & Dunner LLP

(57) ABSTRACT

An ion implanting apparatus is provided with a control apparatus 22 for controlling the filament current passing to the respective filaments 6 in accordance with the beam current IB measured by a plurality of beam current measuring instruments 18. The control apparatus 22 performs, at least once respectively, ① the current value control routine which calculates average values of all beam current measured by the beam current measuring instruments 18, and increases and decreases the respective filament current IF such that the average value comes near to the set value, and ② the uniformity control routine which groups the beam current measuring instruments 17 into the number of the filaments, seeks for a maximum value and the minimum value from all the measured values of the beam current IB, decides groups to which the maximum value and the minimum value belong, decreases the filament current IF passing to the filaments 6 corresponding to the maximum value, and increases the filament current IF passing to the filaments 6 corresponding to the minimum value.

9 Claims, 20 Drawing Sheets

ION IMPLANTING APPARATUS

BACKGROUND OF THE INVENTION

1. Field of the Invention

The present invention relates to an ion implanting apparatus of carrying out ion implanting by irradiating to a substrate ion beam brought out from an ion source having a plurality of filaments, and in particular an improvement of means for controlling beam current of the ion beam brought out from the ion source to be at a predetermined value and an excellent uniformity as well.

2. Description of the Related Art

A conventional example of this kind of ion-implanting apparatus is shown in FIG. 8. This ion implanting apparatus is also called as an ion doping apparatus (or an ion implanting apparatus of non-mass separating type) which directly irradiates to a substrate 14 an ion beam 12 of large area brought out from the ion source 2 as it is, not passing through a mass separator, so as to carry out the ion implanting to the substrate 14. When implanting the ion, if required, the substrate 14 may be mechanically scanned within an area of implanting the ion beam, for example, in directions from an inside to an outside of this FIG. 8 drawn paper. The substrate 14 is such as a glass substrate or semi-conductor substrate.

The ion source 2 is also called as a bucket type ion source (or a multi-polar magnetic field type ion source) which has a plurality of filaments 6 (for example, three) within a plasma production container 4, so that an arc discharge is generated between each filament 6 and the plasma production container 4 to ionize gas of the ion source and generate the plasma 8, and the ion beam 12 is brought out from the plasma 8 by an extension electrode system 10. A magnet for forming multi-polar magnetic field is not illustrated.

To the respective filaments 6, in this example, filament sources 16 are connected, and filament current IF heating the filament 6 can be independently passed from each filament source 16 to each filament 6.

For controlling the beam current of the ion beam 12 brought out from the ion source 2 to be at a predetermined value, this ion implanting apparatus receives a further ion beam 12 and measures the beam current in a plurality of positions within a plane crossing with the ion beam 12. The ion implanting apparatus is provided with a plurality of beam current measuring instruments 18, the number of which is more (for example 24) than the number of the filaments 6 and provided with a control apparatus 20 which demands an average value of the beam current IB measured by the respective beam current measuring instruments 18 and controls increase and decrease by the same amount of the filament currents IF passing to the respective filaments 6 such that the average value approaches to a fixed value.

Each of the beam current measuring instruments 18 is composed of such as Faraday cup, and is disposed, for example, in a straight line within an irradiating area of the ion beam 12. While the ion beam 12 is measured by the beam current measuring instrument 18, the substrate 14 is moved to a place not to interrupt the ion beam 12.

In the ion implanting apparatus, the ratio of the filament current IF passing to the respective filaments 6 is set in advance such that the uniformity of the ion beam 12 is made good, and the ion implanting apparatus is operated.

However, since changing manners of the respective filaments 6 with time passing are ordinarily different one another, if serving the above mentioned control apparatus 20 which increases and decreases by the same amount the filament current IF flowing to the respective filaments 6, there arises a problem that the uniformity of the ion beam 12 is worsened with the time passing of the filaments 6.

JP-A-3-134937 discloses a technology of providing the beam current measuring instruments of the same number as that of the filaments, and controlling the filament current flowing to the respective filaments such that the beam current to be measured by the respective beam current measuring instruments meets the set values.

Although, in this published technology, it seems to be possible to uniform the ion beams by making the respective set values equal one another, actually the control of the filament current flowing to one filament gives influences to plasma density in the vicinity of other filaments, and gives in its turn influence to beam current to be measured by other beam measuring instruments, that is, the controls of the filament current affect one another. If a beam current of one measuring point is controlled to be at a predetermined value, another beam current at another measuring point gets off from the predetermined value, and if trying to control this off beam current to be at the predetermined value, that beam current controlled to have been at the one measuring point gets off from the predetermined value. This is a serious problem that the control causes hunting and does not converge.

There is further proposed an (PJ-A-11-123973), in which the filament current is controlled to pass to the filaments in accordance with a plurality of beam current measuring instruments and the beam current measured thereby, and a control apparatus is equipped which performs a current value control routine and a uniformity control routine at least once respectively. The ion implanting apparatus prevents deterioration of the uniformity of the ion beam due to change of the filaments by time passing so as to control the beam current of the ion beam to be at the predetermined value and the excellent uniformity as well. One example thereof will be explained with reference to FIGS. 15 to 20.

The ion implanting apparatus illustrated in FIG. 5 is also called as the ion doping apparatus (or the ion implanting apparatus of non-mass separating type) which directly irradiates to the substrate 14 the ion beam 12 of large width brought out from the ion source 2 as it is, not passing through the mass separator, so as to carry out the ion implanting to the substrate.

The substrate 14 is supported on a substrate holder 13 which is somewhat larger than the substrate 14, and both are scanned reciprocally in a direction of arrow D within the irradiating area of an ion beam 12 brought out from the ion source 2 by means of a holder scanning mechanism 15.

The substrate holder 13 and the substrate 14 are, for example, rectangular (square or rectangle) as shown in FIG. 16. The plane shape of the ion beam 12 is, for example, rectangular as shown in FIG. 16.

The ion source 2 is also called as the bucket type ion source (or the multi-polar magnetic field type ion source) which has a plurality of filaments 6 (for example, three) within the plasma production container 4, so that an arc discharge is generated between each filament 6 and the plasma production container 4 to ionize gas of the ion source and generate the plasma 8, and the ion beam 12 is brought out from the plasma 8 by the extension electrode system 10. The magnet for forming multi-polar magnetic field is not illustrated.

To the respective filaments 6, in this example, the filament sources 16 are connected, and the filament current IF heating the filament 6 can be independently passed from each filament source to each filament 6.

For controlling the beam current of the ion beam 12 brought out from the ion source 2 to be at the predetermined value, this ion implanting apparatus further receives the ion beam 12 and measures the beam current in a plurality of positions at a downstream of the scanning area of the substrate holder 13. The ion implanting apparatus is provided with a plurality of beam current measuring instruments 18, the number of which is more (for example 24) than the number of the filaments 6 and provided with the control apparatus 20 which controls the filament current IF to be passed to the respective filaments 6 from the respective filament sources 16 in accordance with the beam current IB measured by the respective beam current measuring instruments 18.

Each of the beam current measuring instruments 18 is, as shown in FIG. 16, disposed within an irradiating area of the ion beam 12 and at the downstream of the scanning area of the substrate holder 13, for example, in a straight line.

The control apparatus 20 repeats, as shown in FIG. 17, a current value control routine (step 230) and a uniformity control routine (step 231) at least once respectively.

One example of the current value control routines is illustrated in FIG. 18. Profiles of the beam before and after controls are schematically illustrated in FIG. 20, and explanation hereafter will be also referred to FIG. 20. 1 to 24 of a lateral axis of FIG. 20 show the numbers from the tail end of 24 pieces of the beam current measuring instruments 18.

The beam current of the ion beam 12 is measured by the respective beam current measuring instruments 18 (step 250). Thereby, for example, a beam profile A of FIG. 20 is obtained. An average value AVE of measured all beam current IB is calculated (step 251).

Whether or not this average value AVE is within a stopping range STP for the set value SET is judged (step 252). The stopping range STP is, for example, within ±3% of the set value SET. Being within the stopping range STP, an purpose of controlling the average value has been already accomplished, and an operation advances to the uniformity control routine shown in the following.

When the average value AVE is not within the stopping range STP, the operation goes forward to a step 253 for judging whether or not the average value AVE is larger than the set value SET, and if it is larger, the operation goes to a step 254 so as to decrease by a predetermined amount the filament current IF passing to all the filaments 6. If it is smaller, the operation goes to a step 255 so as to increase by a predetermined amount the filament current IF passing to all the filaments 6. The increasing or decreasing amount in this example is determined to be almost the same amount (including "the same") each other with respect to all of the filaments 6. In accordance with the increase and the decrease of the filament current IF, emission electron amounts from the respective filaments 6 are increased or decreased, whereby the density of the plasmas 8 in the vicinity of the respective filaments 6 is increased or decreased, and the beam current of the ion beam 12 brought out from the range corresponding to the filaments 6 is increased or decreased.

By the above current value control routine, the average value AVE of the beam current of the ion beam 12 brought out from the ion source 2 is controlled to a direction being near the set value SET. Thus, a beam profile B in, for example, FIG. is obtained. Since the uniformity control routine is not yet exercised under this condition, the beam profile B is shaped similarly to the original profile A, and it seems to move the beam profile A in parallel.

Subsequently, the operation goes forward to the above mentioned uniformity control routine. One example is shown in FIG. 19.

Herein, 24 pieces of beam current measuring instruments 18 (measuring points) are divided in the number of the filaments 6, that is, three groups (step 260). Actually, as shown in FIG. 20, Nos. 1 to 8 beam current measuring instruments 18 are a group 1, Nos. 9 to 16 instruments 18 are a group 2, and Nos. 17 to 24 are a group 3.

Among all of the measured values by all of the beam current measuring instruments 18, a maximum value MAX and a minimum MIN are sought (step 261) so as to respectively determine the groups belonging to the maximum value MAX and the groups belonging to the minimum value MIN (step 262). In an example of FIG. 20, the maximum value MAX belongs to the group 1, and the minimum value MIN belongs to the group 3.

The filament current IF flowing to the filament 6 corresponding to the group 1 to which the maximum value MAX belongs is decreased by a predetermined amount (step 263), and the filament current IF flowing to the filaments 6 corresponding to the group 3 to which the minimum value MIN belongs is increased by a predetermined amount (step 264). Thus, the beam current of the group 1 is decreased, and the beam current of the group 3 is increased.

By the uniformity control routine, the beam current of the group 1 to which the maximum value MAX of the beam profile B belongs is decreased, while the beam current of the group 3 to which the minimum value MIN belongs is increased, so that the control is performed in a direction where the uniformity of the beam current is made good. Thus, the beam profile C, for example, shown in FIG. 9 is obtained.

The uniformity of the beam current can be defined by (MAX−MIN)/(MAX+MIN), using, for example, the maximum value MAX and the minimum value MIN of all measured points.

According to this ion implanting apparatus, the control apparatus 20 performs the current value control routine and the uniformity control routine at least once respectively, thereby enabling to prevent deterioration of the uniformity due to the time passing of the filament 6 and control the beam current of the ion beam 12 to be at the predetermined value (i.e., the set value SET) and the excellent uniformity as well.

Further, depending on the 2 step controls of the current value control routine and the uniformity control routine, there does not occur a problem that the control causes hunting and does not converge, differently from the prior art set forth in JP-A-3-134937, and the control may be stable.

However, in the prior art ion implanting apparatus, as shown in FIG. 16, while the substrate holder 13 is scanned to irradiate the ion beam 12 to the substrate 14 for implanting the ion to the substrate 14, the substrate holder 13 interrupts the ion beam 12 to inject the beam current measuring instrument 18, so that the measured value of the beam current IB is not output from the beam current measuring instrument 18, and therefore during implanting the ion to the substrate 14, the control cannot be performed to the current value and the uniformity of the ion beam 12.

Time to be taken for one scanning reciprocation of the substrate holder 13 is relatively short as 3 to 20 seconds, and although for such short period of time, the lowering of the uniformity of the ion beam 12 by difference in time passing of the respective filaments 6 of the ion source may be ignored time, since the current value of the ion beam 12 is changed gradually as time passes by conditions of the plasma 8 in the ion source 2, it is preferable to control the current value of the ion beam 12 also during implanting the ion to the substrate 14, actually while the substrate holder 13 interrupts the beam current measuring instrument 18. In such a manner, it is possible to more precisely control the amount (dose amount) of implanting the ion to the substrate 14.

SUMMARY OF THE INVENTION

Accordingly, it is a main object of the invention to improve the ion implanting apparatus as shown in FIG. 8 and control the beam current of the ion beam brought out from the ion source thereof to be at the predetermined value and the excellent uniformity as well.

It is another main object of the invention to further improve the ion implanting apparatus as mentioned above and to provide such an ion implanting apparatus which may control, at the predetermined value, the current value of the ion beam brought out from the ion source while the substrate holder interrupts the beam current measuring instrument.

A one ion implanting apparatus of the invention is characterized by providing a control apparatus which controls filament current passing to each of filaments from the filament sources in accordance with beam current measured by a plurality of beam current measuring instruments, and performs a current value control routine and a uniformity control routine at least once respectively said current value control routine for calculating the average value of all beam current measured by the plurality of beam current measuring instruments, and increasing and decreasing the filament current passing to the respective filaments by almost the same amount one another such that the average value comes near to the set value, and said uniformity control routine for grouping said plurality of beam current measuring instruments into the number of the filaments, seeking for a maximum value and a minimum value from all measured values by all beam current measuring instruments so as to respectively decide groups to which the maximum value and the minimum value belong, decreasing the filament current passing to the filaments corresponding to the group to which the maximum value belongs and increasing the filament current passing to the filaments corresponding to the group to which the minimum value belongs.

By the current value control routine, the control is performed in a direction where the average value of the beam current of the ion beam brought out from the ion source comes near to the set value.

On the other hand, by the uniformity control routine, the beam current of the group to which the maximum value of the beam current belongs is decreased, and the beam current of the group to which the minimum value of the beam current belongs is increased, so that the control is performed in the direction where the uniformity of the beam current is made good.

The control apparatus performs the current value control routine and the uniformity control routine at least once respectively, so that the deterioration of the uniformity with time passing of the filament is prevented, and it is possible to control the beam current of the ion beam to be at the predetermined value and the excellent uniformity as well.

In the uniformity control routine, it is sufficient to demand the difference between the maximum value and the minimum value, divide dimensions in difference into a plurality of steps (for example, large, middle, small), and control to differ the amounts of increasing and decreasing the filament current in response to each of the steps. In such a manner, the larger the difference is, the more increasing and decreasing the filament current is, and the beam current may be rapidly increased and decreased, so that the uniformity of the beam current may be rapidly made good.

In the uniformity routine, when the average value of all beam current measured by the plurality of beam current measuring instruments is placed within a predetermined stopping range with respect to the set value and when this average value is larger than this set value, it is sufficient to prohibit the increasing actuation of the filament current passing to the filaments corresponding to the group to which the minimum value belongs, and prohibit the decreasing actuation of the filament current passing to the filaments corresponding to the group to which the maximum value belongs, when the average value is smaller than the set value. In such a manner, in the uniformity control routine, the average value of the beam current can be exactly restrained from beginning to fluctuate and getting out of the stopping range, so that the beam current can be controlled to be at the set value more steadily and more rapidly.

Such a uniformity control routine may be employed, which groups the plurality of beam current measuring instruments into the number of the filaments, calculates the average value of the measured beam current within the respective groups, decides groups having the maximum average value and the minimum average value, decreases the filament current passing to the filaments corresponding to the group having the maximum average value, and increases the filament current passing to the filaments corresponding to the group having the minimum average value. By employing such a uniformity control routine, even if a few of peculiar values or noises are included in the plurality of beam current measured values by the plurality of beam current measuring instruments, since the control is performed in accordance with the average value per each of groups, beam current can be controlled by suppressing the peculiar values or noises to be low.

In the uniformity control routine, it is sufficient to demand the difference between the maximum average value and the minimum average value, divide dimensions in the difference into a plurality of steps (for example, large, middle, small), and control to differ the amounts of increasing and decreasing the filament current in response to each of the steps. In such a manner, the larger the difference is, the more increasing and decreasing the filament current is, and the beam current may be rapidly increased and decreased, so that the uniformity of the beam current may be rapidly made good.

In the uniformity routine, when the average value of all beam current measured by the plurality of beam current measuring instruments is placed within a predetermined stopping range with respect to the set value and this average value is larger than this set value, it is sufficient to prohibit the increasing actuation of the filament current passing to the filaments corresponding to the group to which the minimum value belongs, and prohibit the decreasing actuation of the filament current passing to the filaments corresponding to the group to which the maximum value belongs, when the average value is smaller than the set value. In such a manner, in the uniformity control routine, the average value of the beam current can be exactly restrained from beginning to fluctuate and getting out of the stopping range, so that the beam current can be controlled to be at the set value more steadily and more rapidly.

Another ion implanting apparatus according to the invention is characterized by providing a control apparatus which controls filament current passing to the respective filaments from the filament sources in accordance with beam current measured by the beam current measuring instruments, and performs a current value control routine and a uniformity control routine at least once respectively, said current value control routine for calculating the average value of all beam current measured by the plurality of beam current measuring instruments, and increasing and decreasing the filament current passing to the respective filaments by almost the same amount each other such that the average value comes near to the set value, and said uniformity control routine for grouping said plurality of beam current measuring instruments into the number of the filaments, respectively calculating the average values of the plurality of beam current measuring instruments into the number of the filaments, deciding one group having the average value of a largest difference with respect to the set values, decreasing the filament current passing to the filaments corresponding to said group when the average value of this group is larger than said set value, and increasing the filament current when the average value is smaller than said average value.

By the current value control routine, the control is performed in a direction where the average value of the beam current of the ion beam brought out from the ion source is near to the set value.

On the other hand, by the uniformity control routine, the beam current of the group having the average value of a largest difference with respect to the set values is increased and decreased, so that the control is performed in a direction where the uniformity of the beam current is made good.

The control apparatus performs the current value control routine and the uniformity control routine at least once respectively, so that the deterioration of the uniformity with time passing of the filaments is prevented, and it is possible to control the beam current of the ion beam to be at the predetermined value and the excellent uniformity as well.

In the uniformity control routine, it is sufficient to demand the difference between the maximum average value and the minimum average value, divide dimensions in the difference into a plurality of steps (for example, large, middle, small), and control to differ the amounts of increasing and decreasing the filament current in response to each of the steps. In such a manner, the larger the difference is, the more increasing and decreasing the filament current is, and the beam current may be rapidly increased and decreased, so that the uniformity of the beam current may be rapidly made good.

The ion implanting apparatus of the invention receives the ion beam brought out from the ion source and measures the beam current thereof. The ion implanting apparatus is disposed outside of the scanning range of the substrate holder and is furnished with a non-shield beam current measuring instrument which is not shielded by the substrate holder during scanning.

Moreover, the ion implanting apparatus according to the invention performs a control before scanning of the substrate and a control during scanning per one reciprocal scanning of the substrate holder, the control before scanning for repeating at predetermined times the current value control routine and the uniformity control routine before scanning of the substrate holder, and the control during scanning of the substrate for storing as a target a measured value by the non shield beam current measuring instrument immediately before scanning of the substrate holder and increasing and decreasing filament current passing to the filaments by the same amount such that the measured value by the non shield beam current measuring instrument approaches the target value.

In accordance with the above mentioned structure, before scanning of the substrate holder, similarly to the precedent example, the current value control routine and the uniformity control routine are repeated at the predetermined times (control before scanning) following the beam current measured by a plurality of beam current measuring instruments. It is possible thereby to control the beam current of the ion beam from the ion source to be at the predetermined value and the excellent uniformity as well.

On the other hand, during scanning of the substrate holder, the filament current passing to the respective filaments of the ion source is controlled (control during scanning) such that the measured value by the non shield beam current measuring instrument approaches the target value stored immediately before scanning of the substrate holder.

Accordingly, also while the substrate holder shields the beam current measuring instrument, the beam current value of the ion beam brought out from the ion source can be controlled at the redetermined value.

Since the controls before and during scanning are performed per one reciprocal scanning of the substrate holder, the ion can be implanted to the substrate at the exact beam current value and the ion beam of excellent uniformity.

PREFERRED EMBODIMENTS OF THE INVENTION

Figure 1:
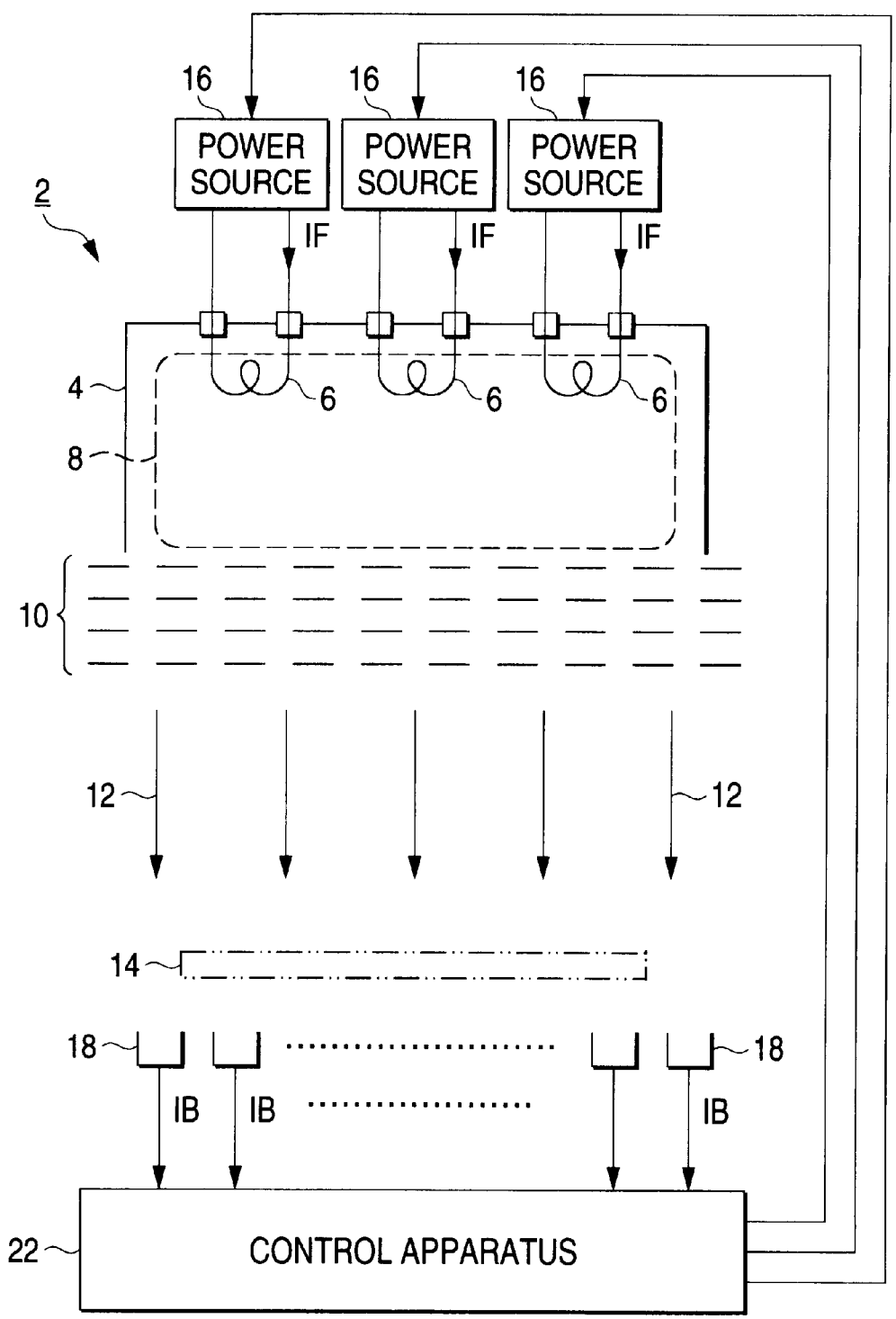
FIG. 1 is a view showing one example of the ion implanting apparatus according to the invention.
Figure 8:
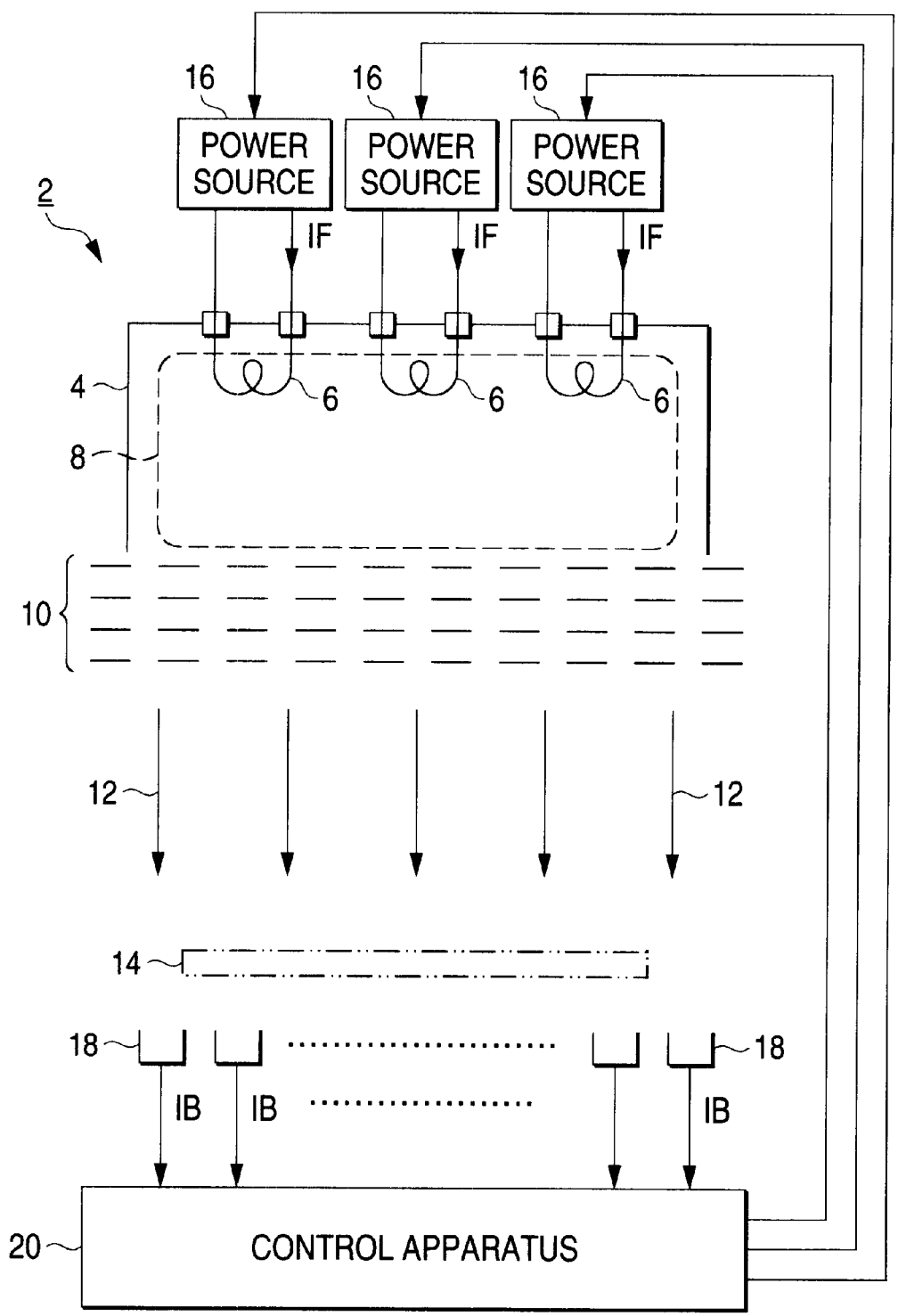
FIG. 8 is a view showing one example of a prior art ion implanting apparatus.

FIG. 1 is a view showing one example of the ion implanting apparatus according to the invention. The same as or corresponding parts to those of the prior art example shown in FIG. 8 will be given the same numerals, and in the following, reference will be mainly made to differences from the prior art.

The present ion implanting apparatus is equipped with a control apparatus 22 in place of the conventional control apparatus 20.

The control apparatus 22 controls the filament current IF passing to the respective filaments 6 from the filament sources 16 in accordance with the ion beam IB measured by the respective beam current measuring instruments 18, and performs the current value control routine and the uniformity control routine at least once respectively as will be stated in detail.

Figure 2:
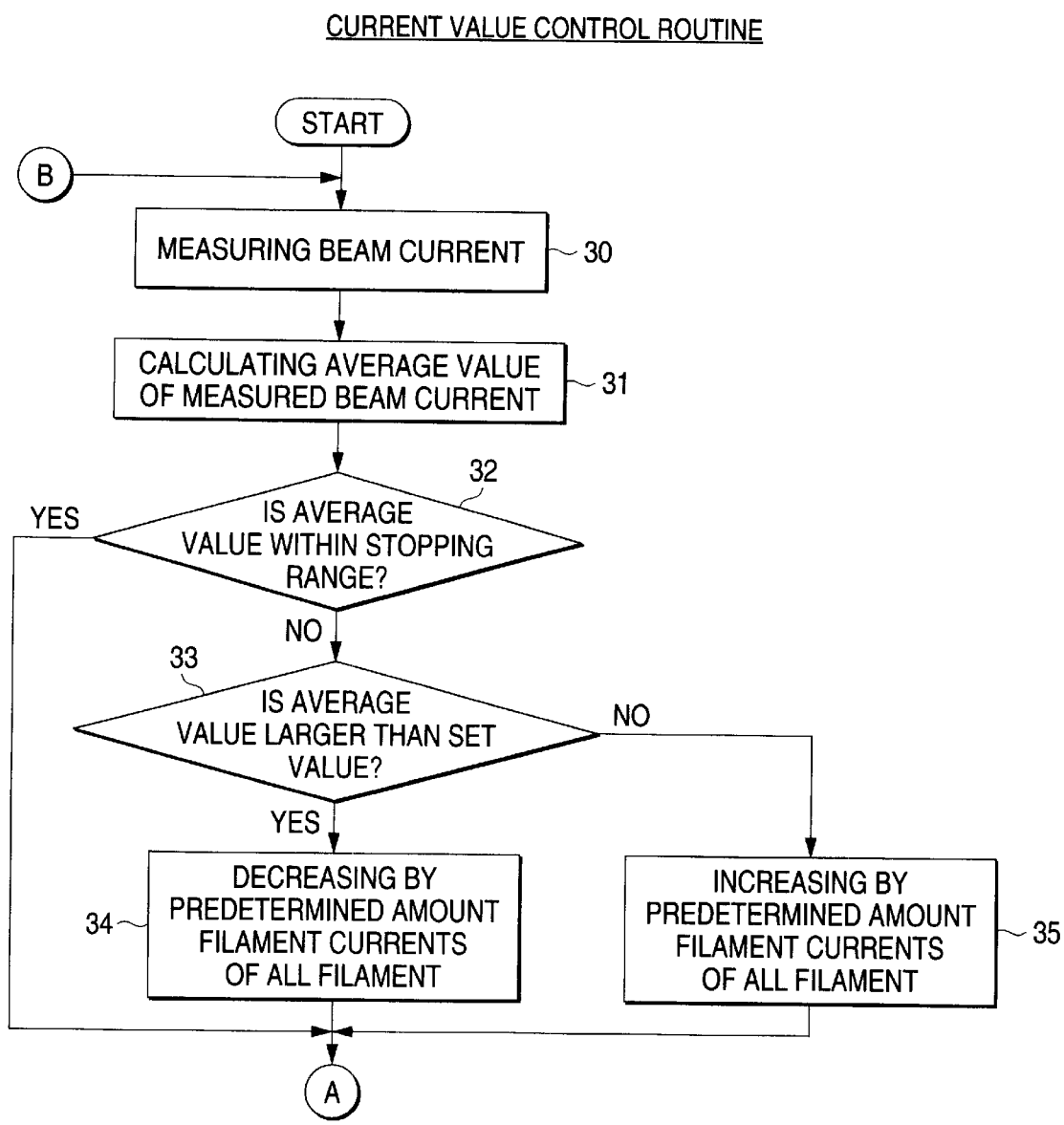
FIG. 2 is a flow chart showing one example of the current value control routine in the control apparatus of FIG. 1.
Figure 7:
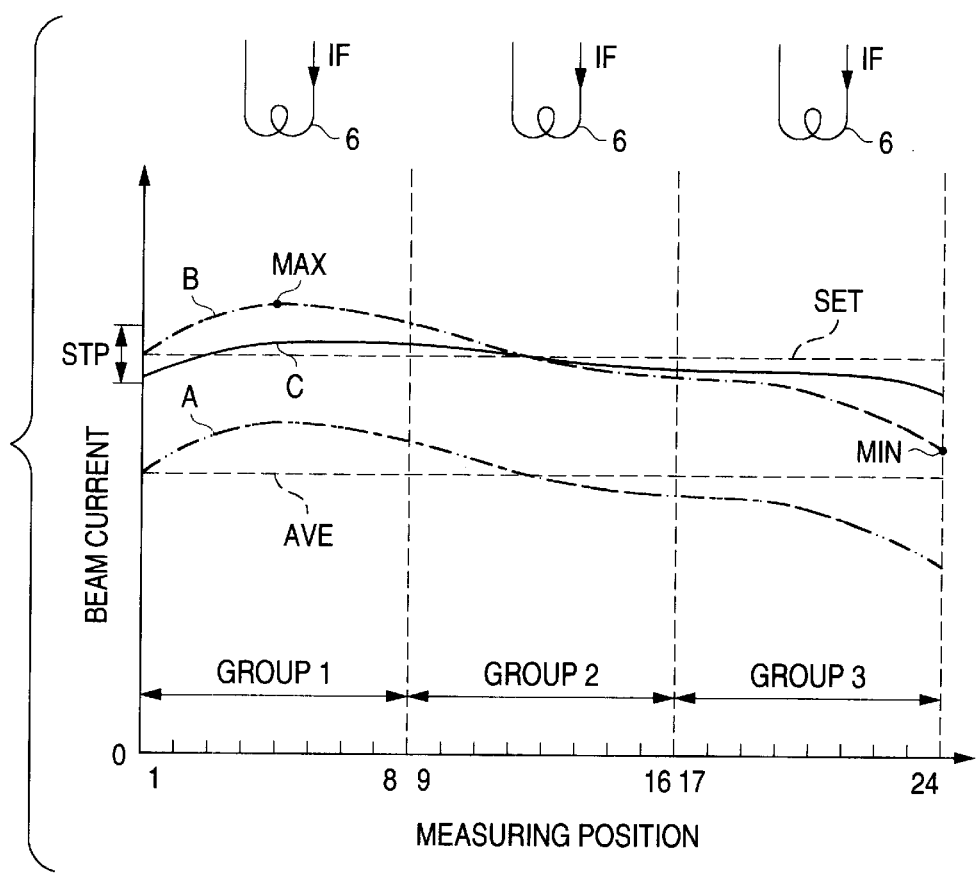
FIG. 7 is a view showing a schematic example of beam profile before and after the control.

One example of the current value control routine is shown in FIG. 2. A schematic example of the beam profile before and after the control is shown in FIG. 7. In the following explanation, FIG. 7 will be referred to. The numerals 1 to 24 of the lateral axis of FIG. 7 indicate the numbers from the tail end of 24 pieces of the beam current measuring instruments 18.

The beam current of the ion beam 12 is measured by the respective beam current measuring instruments 18 (Step 30). Thereby, for example, the beam profile A of FIG. 7 is obtained. The average value AVE of measured all beam current IB is calculated (Step 31).

Whether or not this average value AVE is within a stopping range STP for the set value SET is judged (Step 32). The stopping range STP is, for example, within ±3% of the set value SET. Being within the stopping range STP, an purpose of controlling the average value has been already accomplished, and an operation advances to the uniformity control routine shown in FIGS. 3, 4, 5, 6 or 9.

When the average value AVE is not within the stopping range STP, the operation goes forward to a Step 33 for judging whether or not the average value AVE is larger than the set value SET, and if it is larger, the operation goes to a Step 34 so as to decrease by a predetermined amount the filament current IF passing to all the filaments 6. If it is smaller, the operation goes to a Step 35 so as to increase by a predetermined amount the filament current IF passing to all the filaments 6. The increasing or decreasing amount in this example is determined to be almost the same amount (including "the same") each other with respect to all of the filaments 6. In accordance with the increase and the decrease of the filament current IF, emission electron amounts from the respective filaments 6 are increased or decreased, whereby the density of the plasmas 8 in the vicinity of the respective filaments 6 is increased or decreased, and the beam current of the ion beam 12 brought out from the range corresponding to the filaments 6 is increased or decreased.

By the above current value control routine, the average value AVE of the beam current of the ion beam 12 brought out from the ion source 2 is controlled to a direction being near the set value SET. Thus, a beam profile B in, for example, FIG. 7 is obtained. Since the uniformity control routine is not yet exercised under this condition, the beam profile B is shaped similarly to the original profile A, and it seems to move the beam profile A in parallel.

Figure 3:
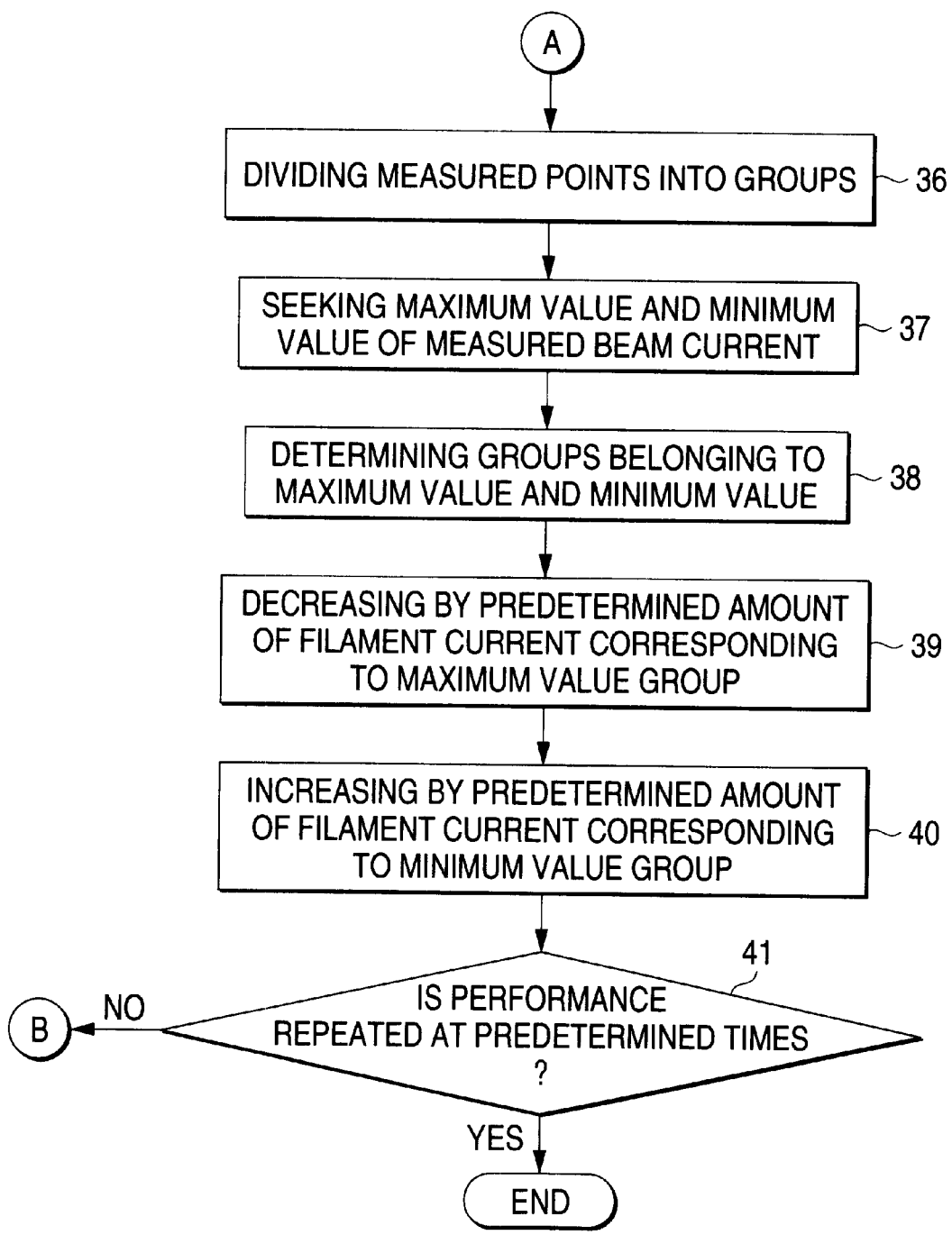
FIG. 3 is a flowchart showing one example of the uniformity control routine in the control apparatus of FIG. 1.

Subsequently, the operation goes forward to the uniformity control routine, for example, as shown in FIG. 3.

Herein, 24 pieces of beam current measuring instruments 18 (measuring points) are divided in the number of the filaments 6, that is, three groups (Step 36). Actually, as shown in FIG. 7, Nos. 1 to 8 beam current measuring instruments 18 are a Group 1, Nos. 9 to 16 instruments 18 are a Group 2, and Nos. 17 to 24 are a Group 3.

Among all of the measured values by all of the beam current measuring instruments 18, a maximum value MAX and a minimum MIN are sought (Step 37) so as to respectively determine the groups belonging to the maximum value MAX and the groups belonging to the minimum value MIN (Step 38). In an example of FIG. 7, the maximum value MAX belongs to the group 1, and the minimum value MIN belongs to the group 3.

The filament current IF flowing to the filaments 6 corresponding to the group 1 to which the maximum value MAX belongs is decreased by a predetermined amount (Step 39), and the filament current IF flowing to the filament 6 corresponding to the group 3 to which the minimum value MIN belongs is increased by a predetermined amount (Step 40). Thus, the beam current of the group 1 is decreased, and the beam current of the group 3 is increased.

By the uniformity control routine, the beam current of the group 1 to which the maximum value MAX of the beam profile B be longs is decreased, while the beam current of the group 3 to which the minimum value MIN belongs is increased, so that the control is performed in a direction where the uniformity of the beam current is made good. Thus, the beam profile C, for example, shown in FIG. 7 is obtained.

The uniformity of the beam current can be defined by (MAX−MIN)/(MAX+MIN), using, for example, the maximum value MAX and the minimum value MIN of all measured points.

The current value control routine and the uniformity control routine are performed at least once respectively, and the respective performances of both routines may be carried out plural times. The number of performing times may be in advance set in the control apparatus 22. Whether or not the performance is repeated at predetermined times is judged by a step 41, and when the repetition is accomplished, the control is finished, and if it is not accomplished, the operation returns to an initial step (Step 30) of the current value control routine so as to repeat the control.

According to this ion implanting apparatus, the control apparatus 22 performs the current value control routine and the uniformity control routine at least once respectively, thereby enabling to prevent deterioration of the uniformity due to the time passing of the filaments 6 and control the beam current of the ion beam 12 to be at the predetermined value (i.e., the set value SET) and the excellent uniformity as well.

Further, depending on the 2 step controls of the current value control routine and the uniformity control routine, there does not occur a problem that the control causes hunting and does not converge, differently from the prior art set forth in the above mentioned publication, and the control may be stable.

If the current value control routine and the uniformity control routine are repeated at plural times respectively, the beam current of the ion beam 12. can be more precisely controlled at the predetermined value, and at the same time the uniformity can be more heightened.

In the uniformity control routine, it is sufficient to demand the difference of the maximum value MAX and the minimum value MIN (i.e., |MAX−MIN|), divide dimensions in difference into a plurality of steps (for example, 3 steps of large, middle, small in reference to a certain value), and control to differ the amounts of increasing and decreasing the filaments IF in response to each of these steps. Namely, in response to the large, middle or small difference, the increasing and decreasing amounts of the filament current IF may be large, middle or small in reference to a certain value.

In such a manner, the larger the difference is, the more increasing and decreasing the filament current is, and the beam current may be rapidly increased and decreased, so that the uniformity of the beam current may be rapidly made good.

In the uniformity control routine, the following restraint may be provided. That is, referring to FIG. 7, in case that the average value AVE is within the stopping range STP with respect to the set value SET, ① when the average value AVE is larger than the set value SET, it is sufficient to prohibit the increasing actuation of the filament current IF passing to the filaments 6 corresponding to the group (Group 3) to which the minimum value MIN belongs, and ② when the average value AVE is smaller than the set value SET, prohibit the decreasing actuation of the filament current passing to the filaments 6 corresponding to the group (Group 1) to which the maximum value MAX belongs.

In the case of ①, even if permitting the increasing actuation of the filament current IF passing to the filaments 6 corresponding to the group 3, the average value AVE is increased by the increasing actuation and probably separates from the set value SET. Reversely, in the case of ②, even if permitting the decreasing actuation of the filament current IF passing to the filaments 6 belonging to the group 1, the average value AVE is decreased by the decreasing actuation and probably separates from the set value SET. In case that such matters occur, the average value AVE probably begins to fluctuate. Therefore, if providing the above mentioned restraint, such matters are prevented, and in the uniformity control routine, the average value AVE of the beam current can be exactly restrained from beginning to fluctuate and getting out of the stopping range STP, so that the beam current can be controlled to be at the set value SET more steadily and more rapidly.

Figure 4:
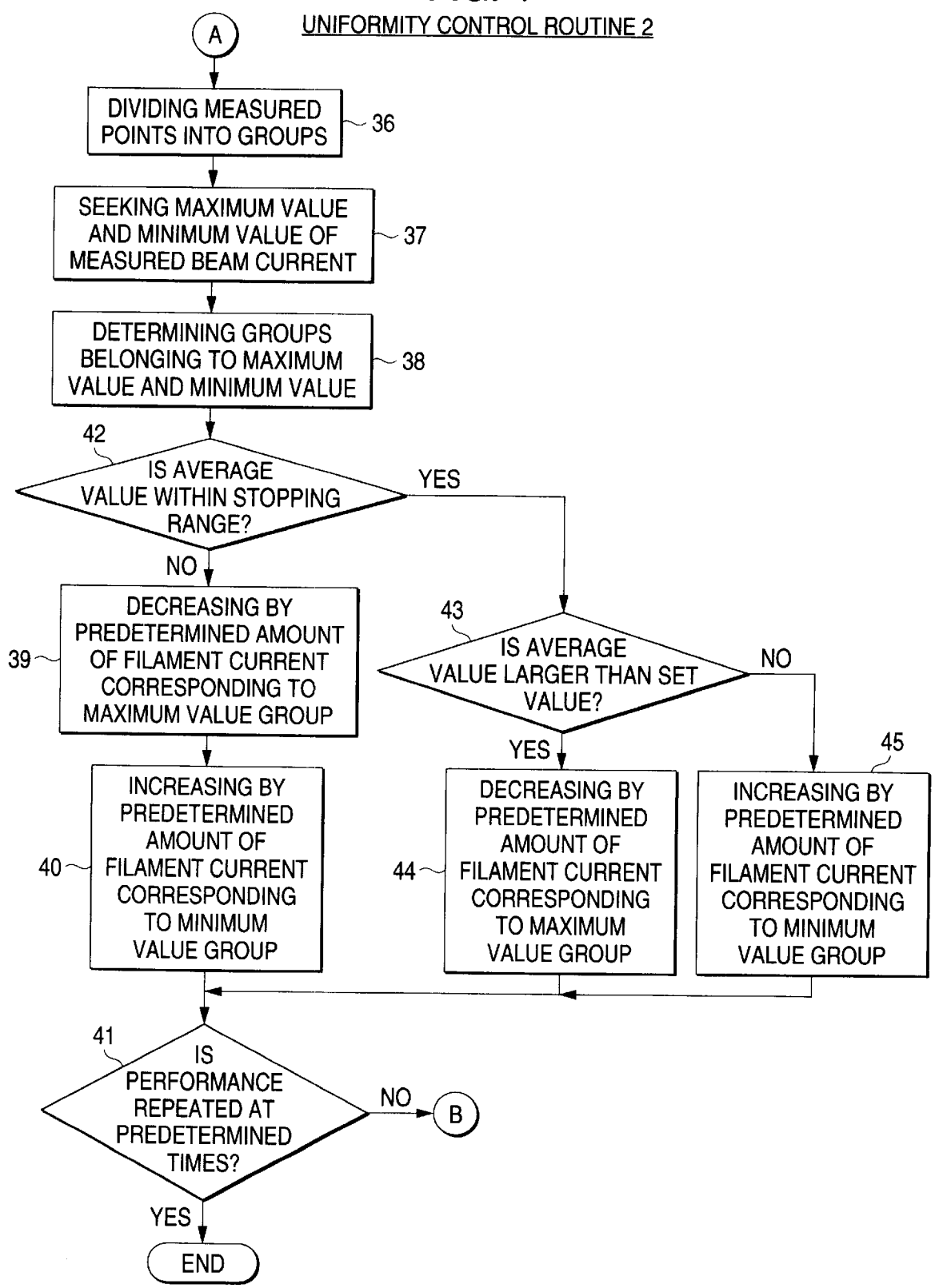
FIG. 4 is a flow chart showing another example of the uniformity control routine in the control apparatus of FIG. 1.

FIG. 4 shows an example of the uniformity control routine provided with the restraint. Addition of steps 42 to 45 is different from the example of FIG. 3. Namely, in the Step 42, whether or not the average AVE is within the stopping range STP is judged, and if being within the stopping range STP, whether or not the average value AVE is larger than the set value SET is further judged in the Step 43, and if larger, the operation advances to the Step 44, the only control is performed, which decreases the filament current IF of the filament 6 corresponding to the group 1 to which the maximum value MAX belongs (that is, the actuation corresponding to the Step 40 is prohibited). If smaller, the operation advances to the Step 45, the only control is performed, which increases the filament current IF of the filament 6 corresponding to the group 3 to which the maximum value MIN belongs (that is, the actuation corresponding to the Step 39 is prohibited).

Figure 5:
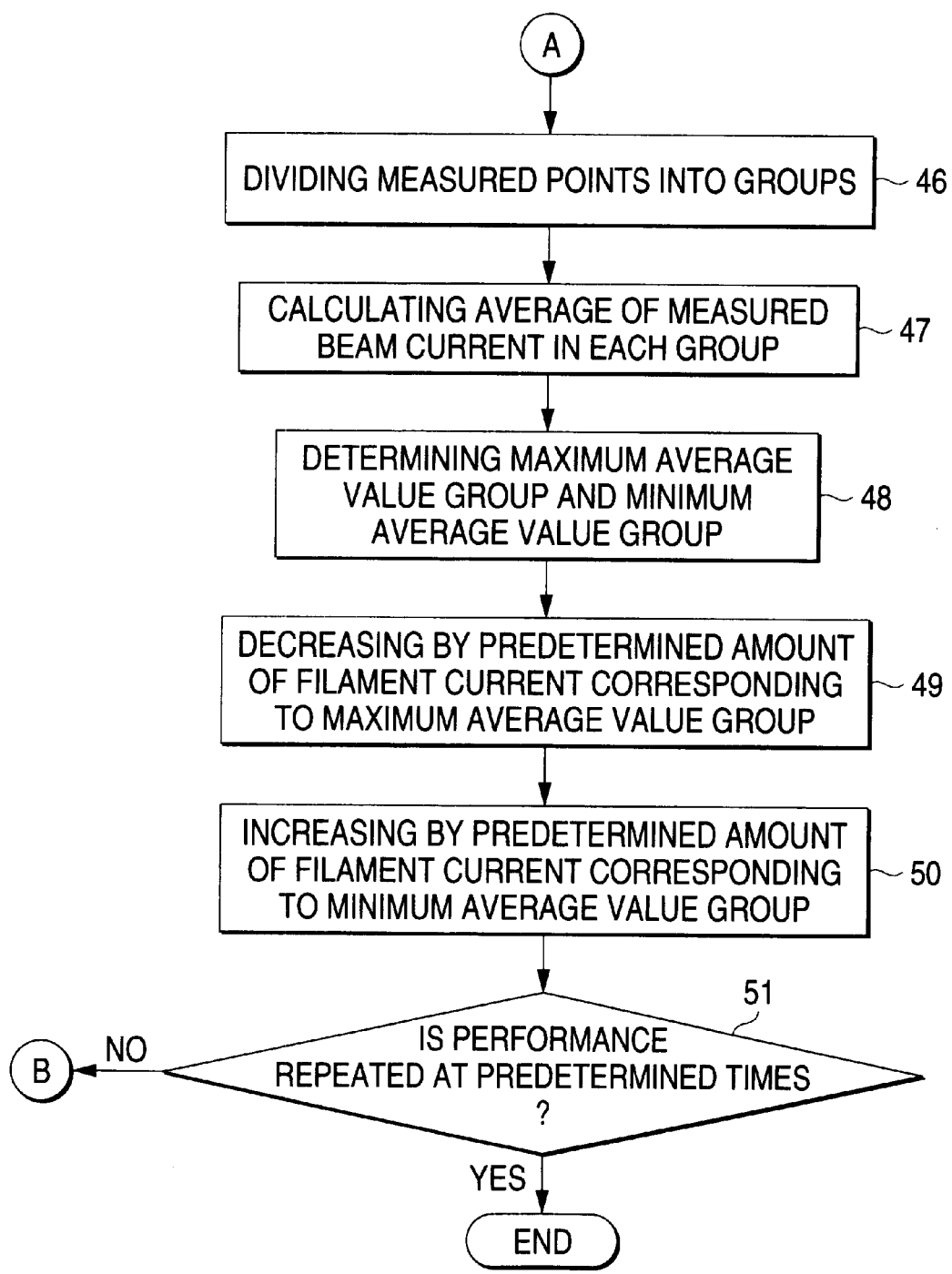
FIG. 5 is a flow chart showing a further example of the uniformity control routine in the control apparatus of FIG. 1.
Figure 6:
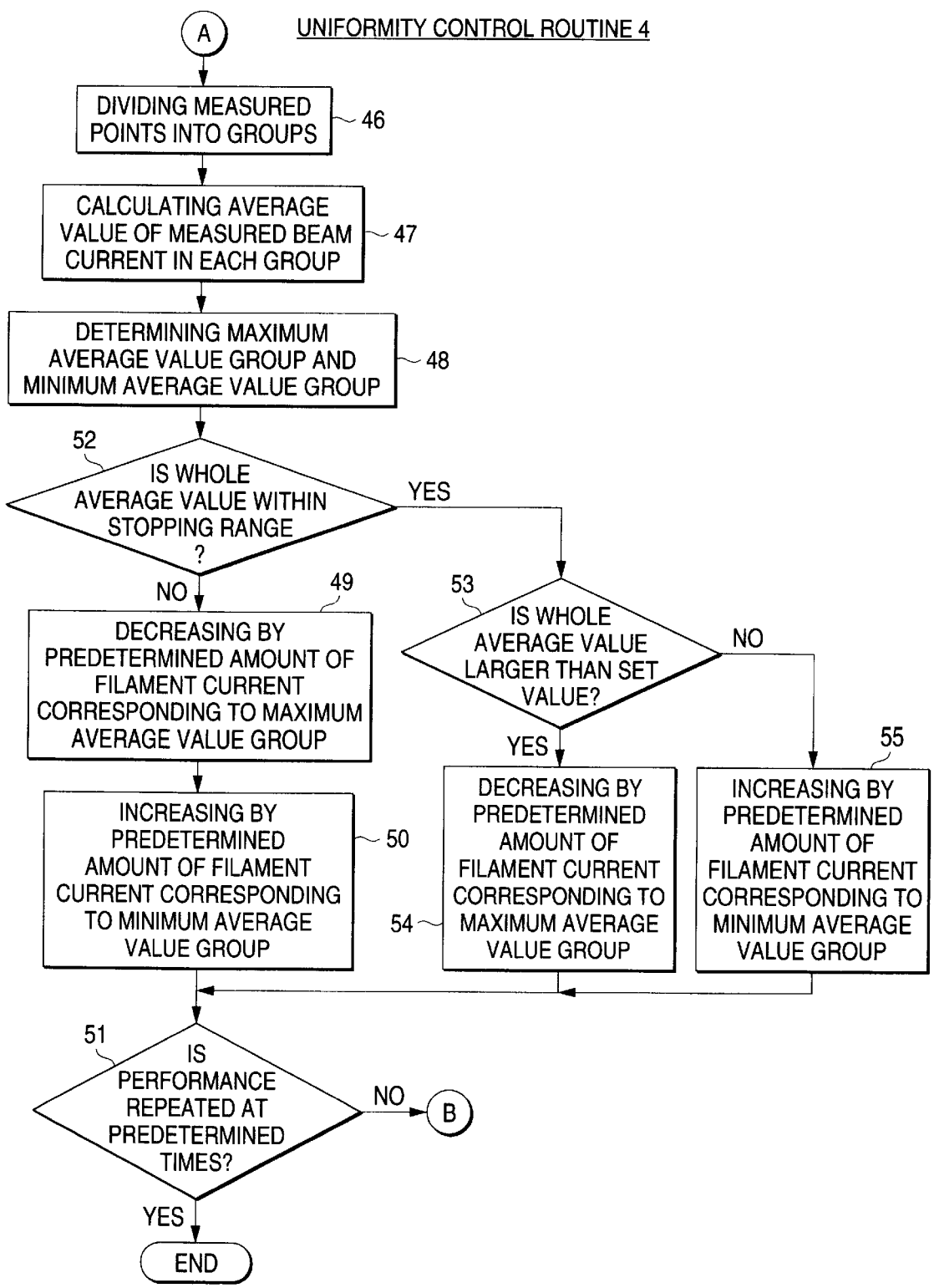
FIG. 6 is a flow chart showing a still further example of the uniformity control routine in the control apparatus of FIG. 1.

Other examples of the uniformity control routine will be shown in FIGS. 5 and 6 respectively.

The uniformity control routine of FIG. 5 corresponds to that of FIG. 3, and differences there from will be mainly concerned. In the uniformity control routine of FIG. 5, the average values of the measured beam current within the Groups to 3 are calculated respectively (Step 47) so as to decide a group having a maximum average value (Group 1 in the example of FIG. 7) and a group having a minimum average value (Group 3 in the example of FIG. 7) (Step 48), decrease the filament current IF passing to the filaments 6 corresponding to the Group 1 having the maximum average value (Step 49) and increase the filament current IF passing to the filament 6 corresponding to the group 3 having the minimum average value (Step 50).

By employing such a uniformity control routine, even if a few of peculiar values or noises are included in the plurality of beam current measured values by the plurality of beam current measuring instruments 18, since the controls are performed in accordance with the average value per each of groups, the beam current can be controlled by suppressing the peculiar values or noises to be low. In other words, if peculiar points or noises happen singly, the uniformity control routine prevents the whole control from being drawn thereby, so that the beam current of the whole ion beam can be exactly controlled.

Also in the uniformity control routine of FIG. 5, similarly to FIG. 3, it is sufficient to demand the difference between the maximum average value and the minimum average value, divide dimensions in difference into a plurality of steps, and control to differ the amounts of increasing and decreasing the filament current IF in response to each of the steps. In such a manner, the larger the difference is, the more increasing and decreasing the filament current is, and the beam current may be rapidly increased and decreased, so that the uniformity of the beam current may be rapidly made good.

Further, similarly to the example of FIG. 4, the Steps 52 to 55 are added to the uniformity control routine of FIG. 5 as the example shown in FIG. 6, and in case that the average value AVE is within the stopping range STP with respect to the set value SET, ① to when the average value AVE is larger than the set value SET, it is sufficient to prohibit the increasing actuation of the filament current IF passing to the filament 6 corresponding to the Group 3 to which the minimum value MIN belongs, and ② when the average value AVE is smaller than the set value SET, prohibit the decreasing actuation of the filament current passing to the filament 6 corresponding to the Group 1 to which the maximum value MAX belongs.

In such a manner, in the uniformity control routine, the average value AVE of the beam current can be exactly restrained from beginning to fluctuate and getting out of the stopping range STP, so that the beam current can be controlled to be at the set value SET more steadily and more rapidly.

The plurality of filament sources 16 are not necessarily independent, but it is allowed that they are united into one to provide one filament source which can supply the filament current IF independently to each of the filaments 6.

The number of the beam current measuring instruments 18 is, for example, multiplication of integer, i.e., the number of the filaments ×2 or more, but it may be not necessarily multiplication of integer. The number of the beam current measuring instruments 18 belonging to the respective groups is not necessarily the same number in each of the groups. It is sufficient to increase the number of the beam current measuring instruments 18 within the group which is desired to be more delicately controlled.

The control as the above mentioned example by the control apparatus 22 may, seeing it as a controlling method, be called as a control method of an ion implanting apparatus, a control method of an ion source, or a self control method of ion beam current.

Subsequently, further reference will be made to the uniformity control routine as an example shown in FIG. 9.

Figure 11:
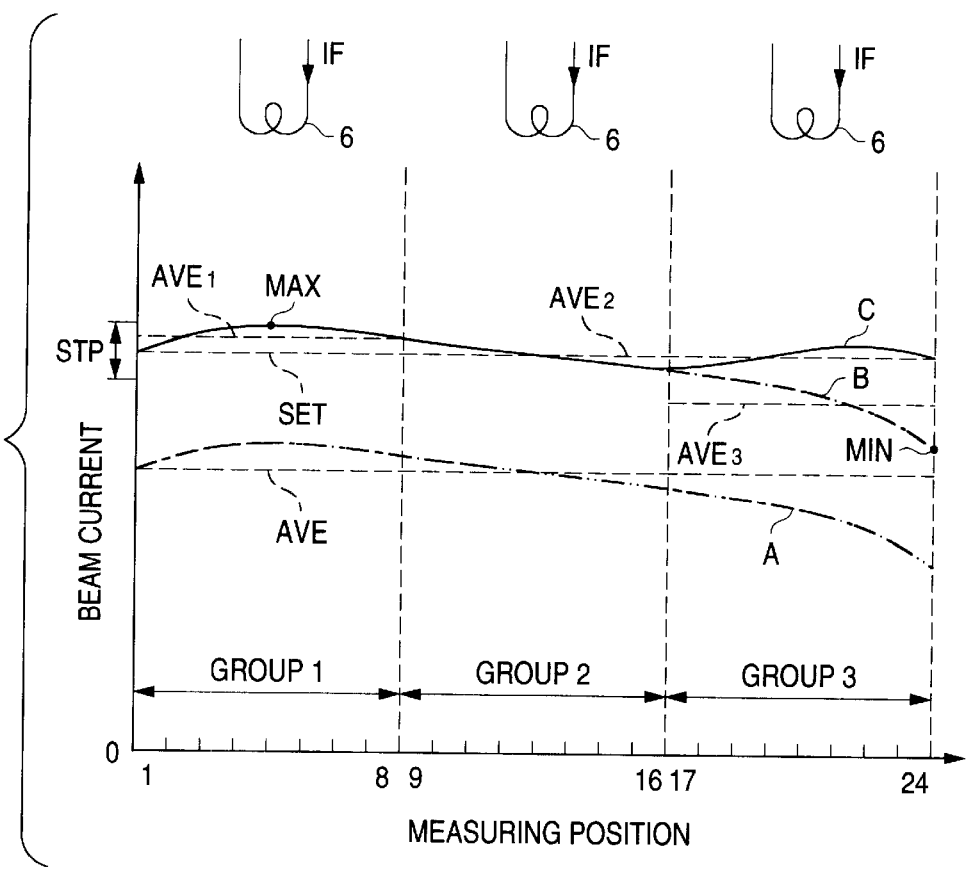
FIG. 11 is a view showing a schematic example of beam profile before and after the control.

Herein, 24 pieces of beam current measuring instruments 18 (measuring points) are divided in the number of the filaments 6, that is, three groups (Step 140). Actually, as shown in FIG. 11, Nos. 1 to 8 beam current measuring instruments 18 are a Group 1, Nos. 9 to 16 instruments 18 are a Group 2, and Nos. 17 to 24 are a Group 3.

The average values $AVE_1$ to $AVE_3$ of the measured beam current in the Groups 1 to 3 are calculated (Step 141) so as to decide one Group having a largest difference with respect to the set value SET (Step 142). In the example of FIG. 11, being $AVE_2 < AVE_1 < AVE_3$, it is the Group 3.

Subsequently, the operation goes to the Step 143 to judge whether or not the average value $AVE_3$ of the Group 3 decided as above is larger than the set value SET, and if larger, the operation goes to the Step 144 to decrease by the predetermined amount the filament current IF passing to the filaments 6 corresponding to the Group 3, and if not large, the operation goes to the Step 145 to judge whether or not the average value $AVE_3$ is larger than the set value SET, and if small, the operation goes to the Step 146 to increase by the predetermined amount the filament current IF passing to the filaments 6 corresponding to the Group 3, and if not small (this fact means $AVE_3 = SET$), the operation goes to the Step 147. In the example of FIG. 11, being $AVE_2 < SET$, it increase by the predetermined amount the filament current IF of the filaments 6 corresponding to the Group 3.

Since the beam current of the Group 3 is increased thereby, the control is performed in the direction where the uniformity of the beam current is made good. As a result, the beam profile C, for example, as shown in FIG. 11 is obtained. Since the control is made to the only the filament current IF of the filaments corresponding to the Group 3, this beam profile C and the above beam profile B have the same shape in the parts other than the Group 3.

The current value control routine and the uniformity control routine are performed at least once respectively, and the respective performances of both routines may be carried out plural times. The number of performing times may be in advance set in the control apparatus 22. Whether or not the performance is repeated at predetermined number is judged by a Step 147, and when the repetition is accomplished, the control is finished, and if it is not accomplished, the operation returns to an initial step (Step 30) of the current value control routine so as to repeat the control.

According to this ion implanting apparatus, the control apparatus 22 performs the current value control routine and the uniformity control routine at least once respectively, thereby enabling to prevent deterioration of the uniformity due to the time passing of the filaments 6 and control the beam current of the ion beam 12 to be at the predetermined value (i.e., the set value SET) and the excellent uniformity as well.

Further, depending on the 2 step controls of the current value control routine and the uniformity control routine, there does not occur a problem that the control causes hunting and does not converge, differently from the prior art set forth in the above mentioned publication, and the control may be stable.

If the current value control routine and the uniformity control routine are repeated at plural times respectively, the beam current of the ion beam 12 can be more precisely controlled at the predetermined value, and at the same time the uniformity can be more heightened. For example, in the example shown in FIG. 11, in the uniformity control routine in a next cycle, the beam profile C is a starting point, and the Group 1 is determined to be as a group having the average value of the largest difference with respect to the set value SET, and the control is performed such that the average value $AVE_1$ comes near to the set value SET, and the uniformity is made better.

In the uniformity control routine, it is sufficient to demand the difference of the set value SET and the average value of the decided Group (i.e., |the set value−the average value|, and in the example of FIG. 11 $|SET-AVE_3|$), divide dimensions in difference into a plurality of steps (for example, 3 steps of large, middle, small in reference to a certain value), and control to differ the amounts of increasing and decreasing the filament IF in response to each of these steps. Namely, in response to the large, middle or small difference, the increasing and decreasing amounts of the filament current IF may be large, middle or small in reference to a certain value.

In such a manner, the larger the difference is, the more increasing and decreasing the filament current is, and the beam current may be rapidly increased and decreased, so that the uniformity of the beam current may be rapidly made good.

Figure 9:
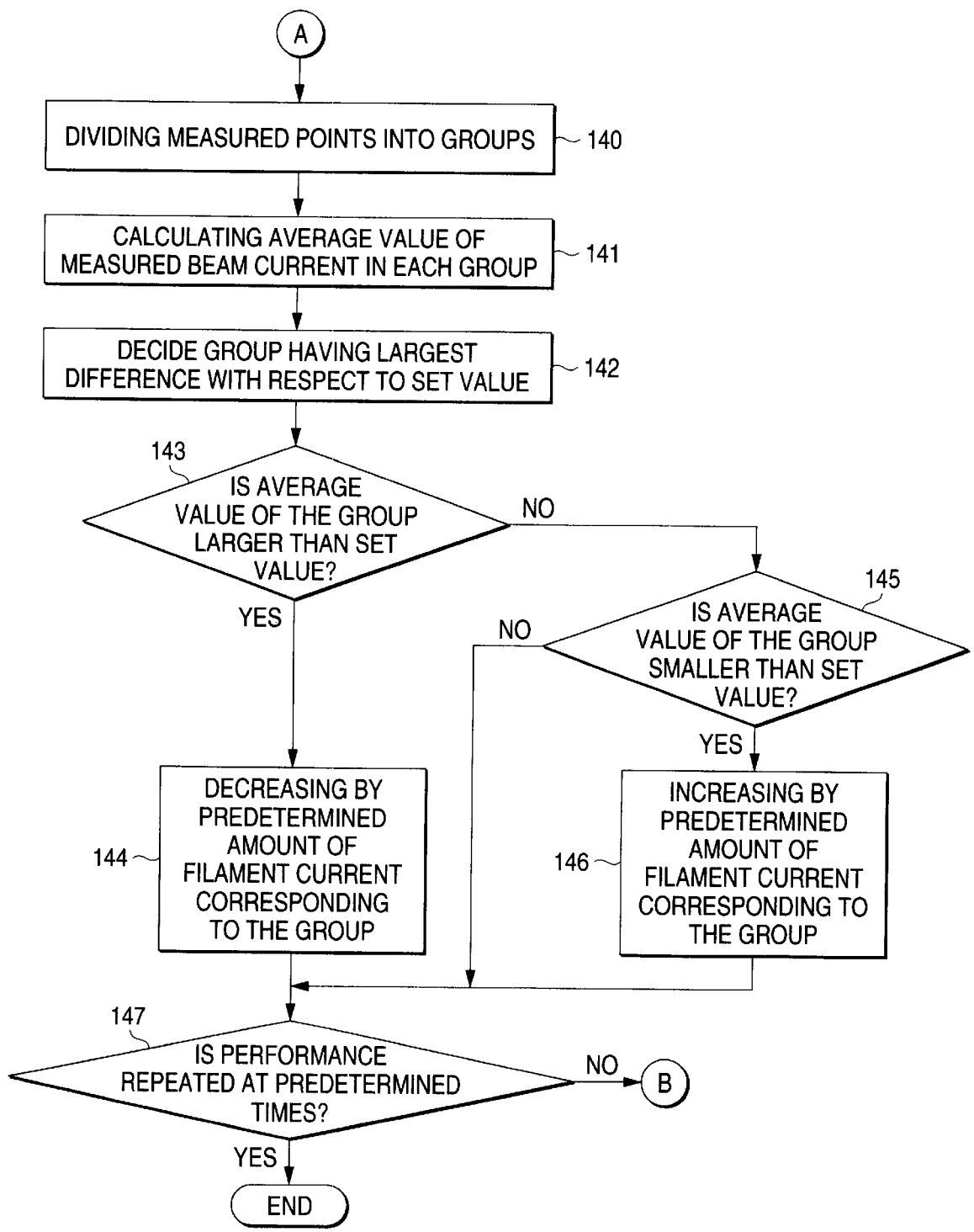
FIG. 9 is a flow chart showing a yet further example of the uniformity control routine in the control apparatus of FIG.
Figure 10:
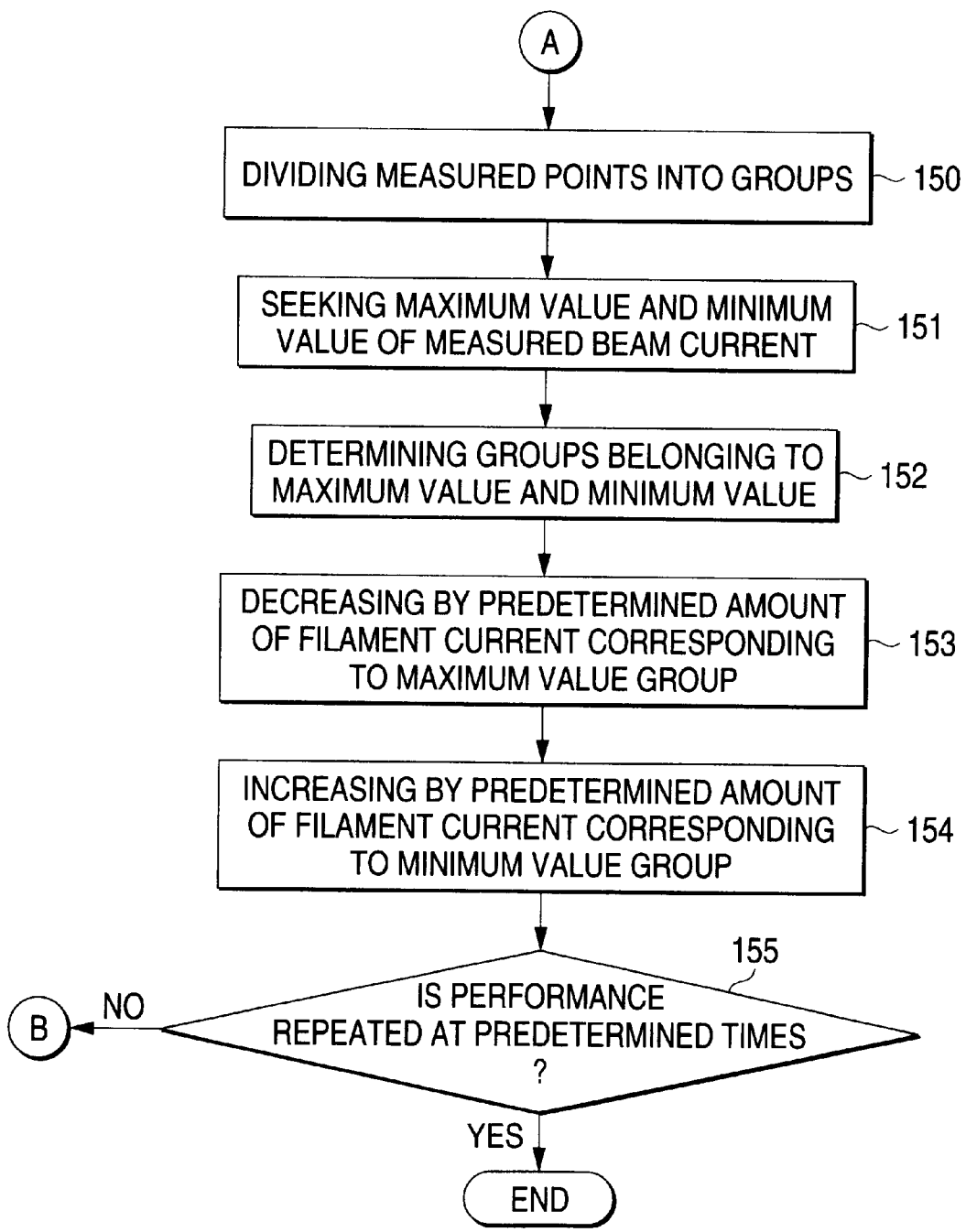
FIG. 10 is a flow chart showing a comparative example of the uniformity control routine.

As to the uniformity control routine, a comparative example shown in FIG. 10 may be considered. The contents of the Steps 150 and 155 of FIG. 10 are almost the same as those of the Steps 140 and 147 of FIG. 9.

In the uniformity control routine of FIG. 10, after the Step 150 is grouped, among all of the measured values by all of the beam current measuring instruments 18, a maximum value MAX and a minimum MIN are sought (Step 151) so as to decide the groups to which the maximum value MAX belongs and the groups to which the minimum value MIN belongs (Step 152), and the filament current IF flowing to the filaments 6 corresponding to the group to which the maximum value MAX belongs is decreased by a predetermined amount (Step 153), and the filament current IF flowing to the filaments 6 corresponding to the group to which the minimum value MIN belongs is increased by a predetermined amount (Step 154). Thus, the beam current of the Group 1 to which the maximum value MAX of the beam profile B belongs is decreased and the beam current of the Group 3 to which the minimum value MIN belongs is increased, and the control is performed in the direction where the uniformity of the beam current is made good.

However, when employing the uniformity control routine of FIG. 10, if controlling from an inferior condition of the uniformity, there may be a case that it takes relatively long time for bringing the beam current to the set value SET. That is, the maximum value MAX and the minimum value MIN being references for increasing and decreasing the filament current IF are all relative values within the measured points, for example, if considering with FIG. 11 that the average value $AVE_3$ of the whole beam profile B after the current value control routine is smaller than the set value SET (but within the stopping range), the control is performed, in the uniformity control routine, to lower the filament current IF of the Group 1 where the maximum value MAX exists. However, this is a control in the direction where the average value $AVE_3$ is separated from the set value SET, and is contrary to the above mentioned current value control routine. Accordingly, it takes time for bringing the beam current to the set value SET.

In contrast, in the uniformity control routine of FIG. 9, since such a control is only performed, which brings to the set value SET the average value (in the case of the beam profile B of FIG. 11, the average value $AVE_3$) of one group having the largest average value for the set value SET, the control is certainly performed in a direction the average value $AVE_3$ of the hole of the beam profile B certainly comes near to the set value SET. Namely, a control contrary to the precedent current value control routine is not performed. Accordingly, the beam current can be rapidly brought to the set value SET as such.

Further, in the uniformity control routine, since the control is performed in accordance with the average value per each group, even if a few of peculiar values or noises are included in the plurality of beam current measured values by the plurality of beam current measuring instruments 18, the influence thereof to the average value is few and accordingly, the beam current can be controlled by suppressing the peculiar values or noises to be low. In other words, if peculiar points or noises happen singly, the uniformity control routine prevents the whole control from being drawn thereby, so that the beam current of the whole ion beam can be exactly controlled. The uniformity control routine of FIG. 10 might be probable to detect the peculiar value or noises as the maximum value MAX or the minimum value MIN, the uniformity control routine of FIG. 9 is excellent also in this regard.

The plurality of filament sources 16 are not necessarily independent, but it is allowed that they are united into one to provide one filament source which can supply the filament current IF independently to each of the filaments 6.

The number of the beam current measuring instruments 18 is, for example, multiplication of integer, i.e., the number of the filaments ×2 or more, but it may be not necessarily multiplication of integer. The number of the beam current measuring instruments 18 belonging to the respective groups is not necessarily the same number in each of the groups. It is sufficient to increase the number of the beam current measuring instruments 18 within the group which is desired to be more delicately controlled.

The control as the above mentioned example by the control apparatus 22 may, seeing it as a controlling method, be called as a control method of an ion implanting apparatus, a control method of an ion source, or a self control method of ion beam current.

[Mode for Carrying Out the Invention]

Figure 12:
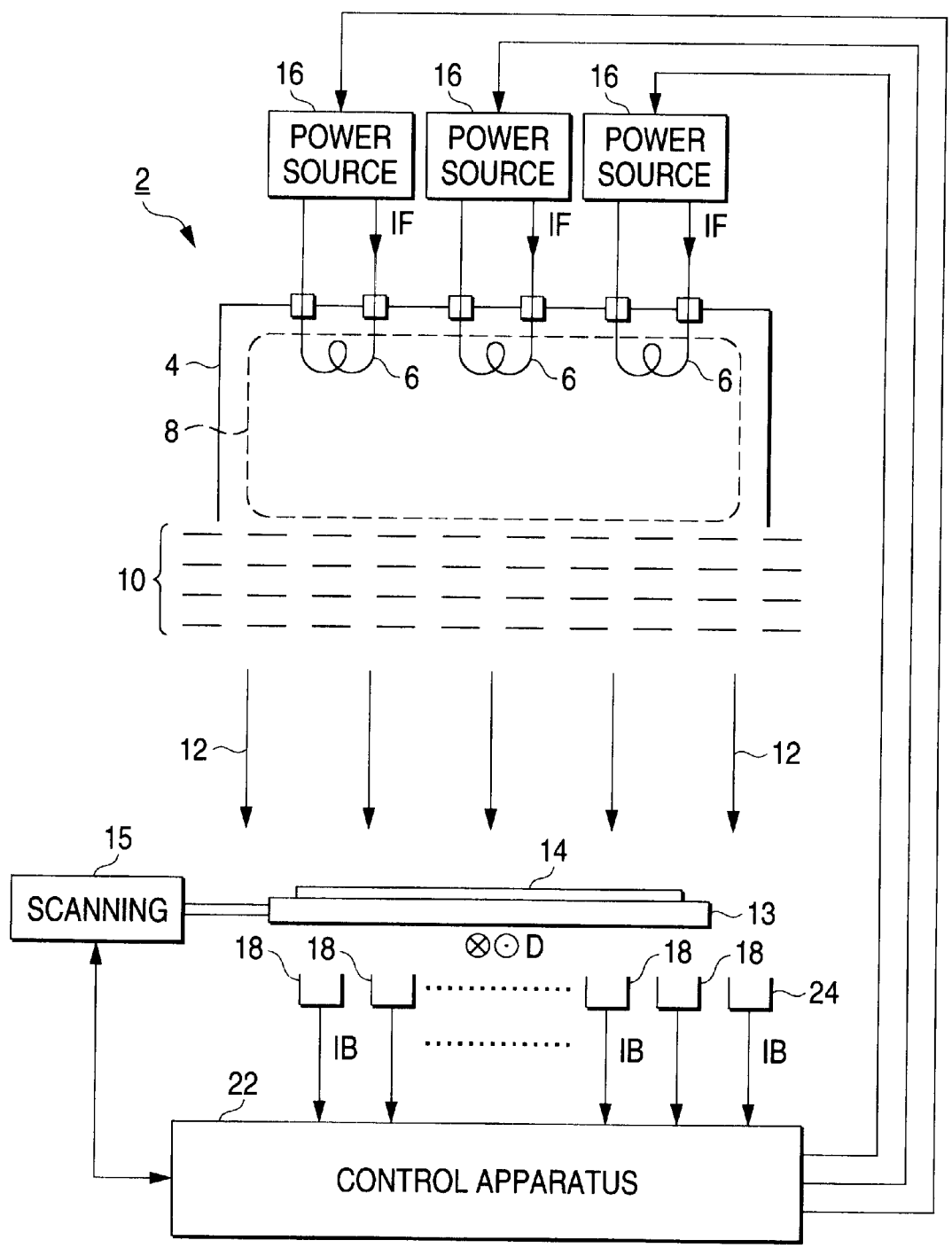
FIG. 12 is a view showing one example of the ion implanting apparatus according to the invention.
Figure 13:
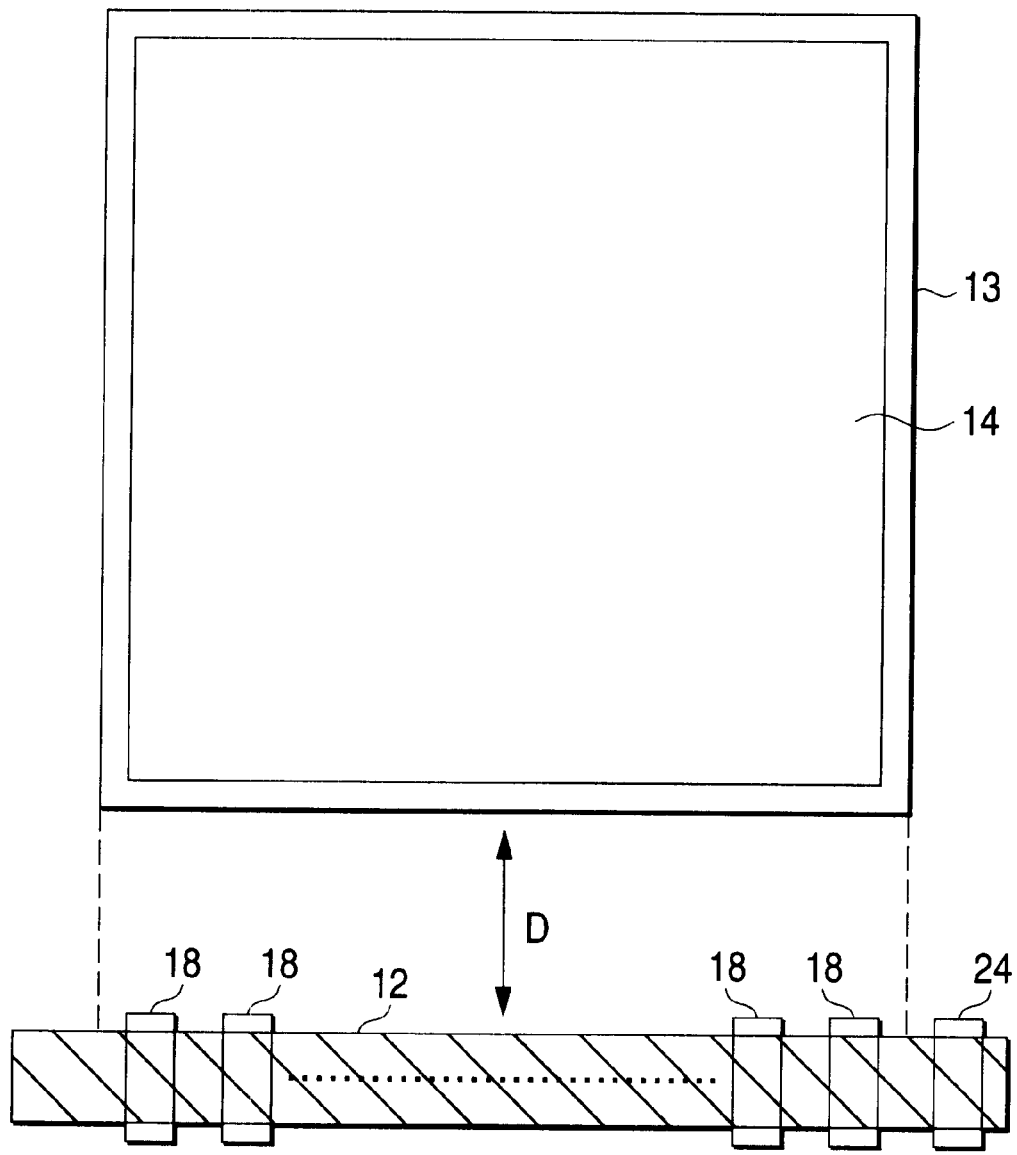
FIG. 13 is a plan view around the substrate holder of the apparatus of FIG. 12.

FIG. 12 is a view showing another example of the ion implanting apparatus according to the invention. FIG. 13 is a plan view around the substrate holder of the apparatus of FIG. 12. The same as or corresponding parts to those of the prior art example will be given the same numerals, and in the following, reference will be mainly made to differences from the prior art.

This ion implanting apparatus receives the ion beam 12 brought out from the ion source 2 and measures the beam current IB thereof, and is disposed outside of the scanning range of the substrate holder 13 and is furnished with the non-shielding beam current measuring instrument 24 which is not shielded by the substrate holder during scanning, and is composed of such as the Faraday cup similarly to the beam current measuring instruments 18.

The present ion implanting apparatus is equipped with a control apparatus 22 in place of the conventional control apparatus 20.

The control apparatus 22 in this example is based on the beam current IB measured by the beam current measuring instrument 18 and the non-shielding beam current measuring instrument 24 and is further based on the scanning information of the substrate holder 13 by the holder scanning mechanism 15 so as to perform the control before scanning of the Steps 230 to 232 and the control during scanning of the Steps 233 to 239 per each reciprocal scanning of the substrate holder 13.

Figure 17:
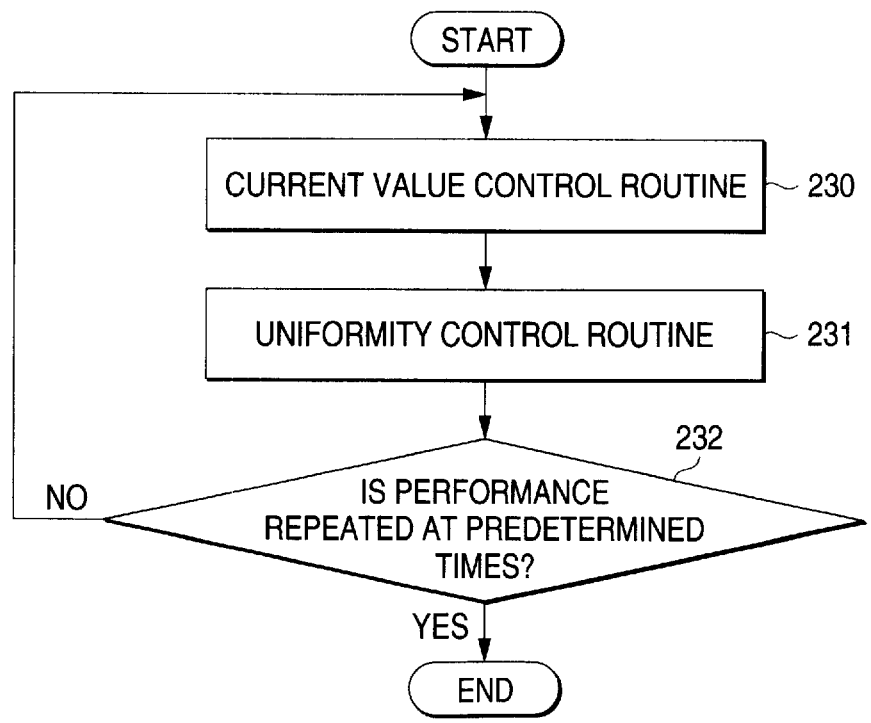
FIG. 17 is a flow chart showing one example of the control content by the control apparatus of FIG. 15.
Figure 18:
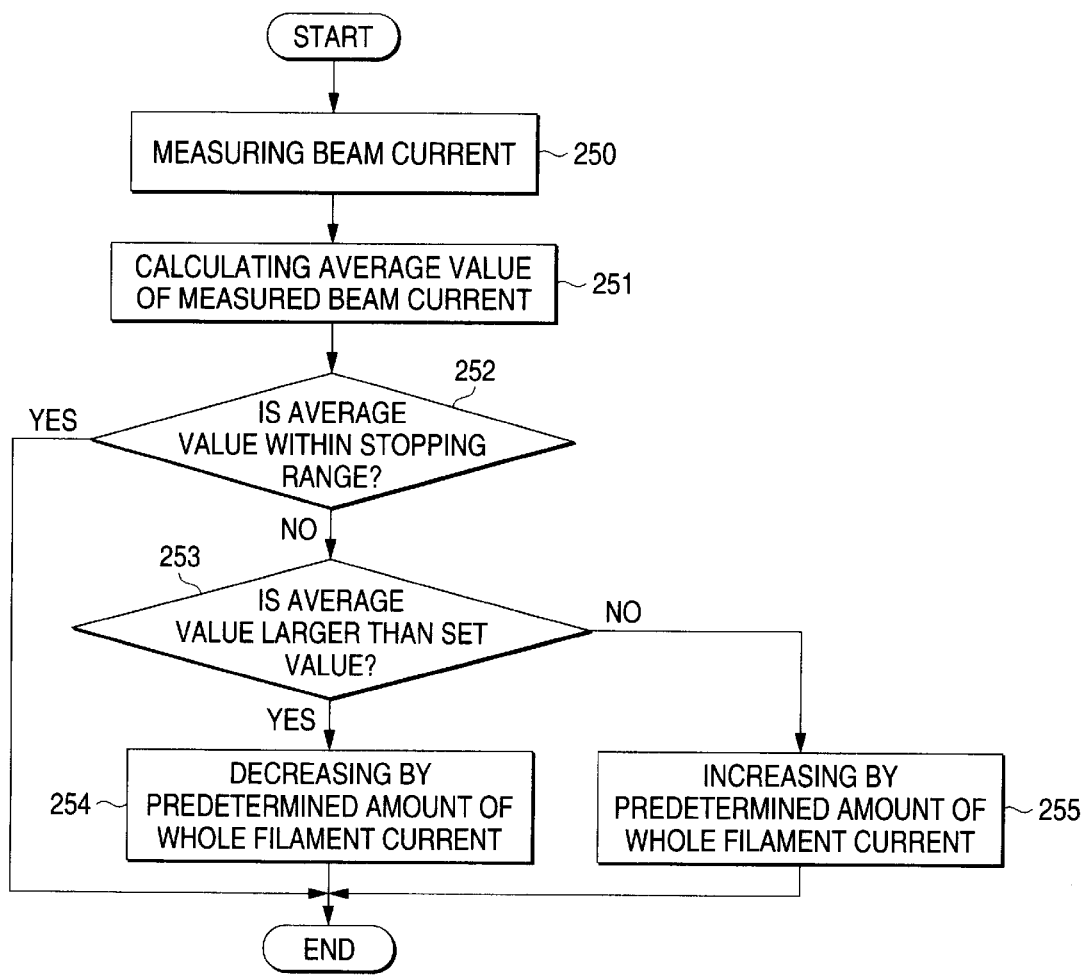
FIG. 18 is a flow chart showing one example of the current value control routine in the control apparatus of FIGS. 12 and 15.
Figure 19:
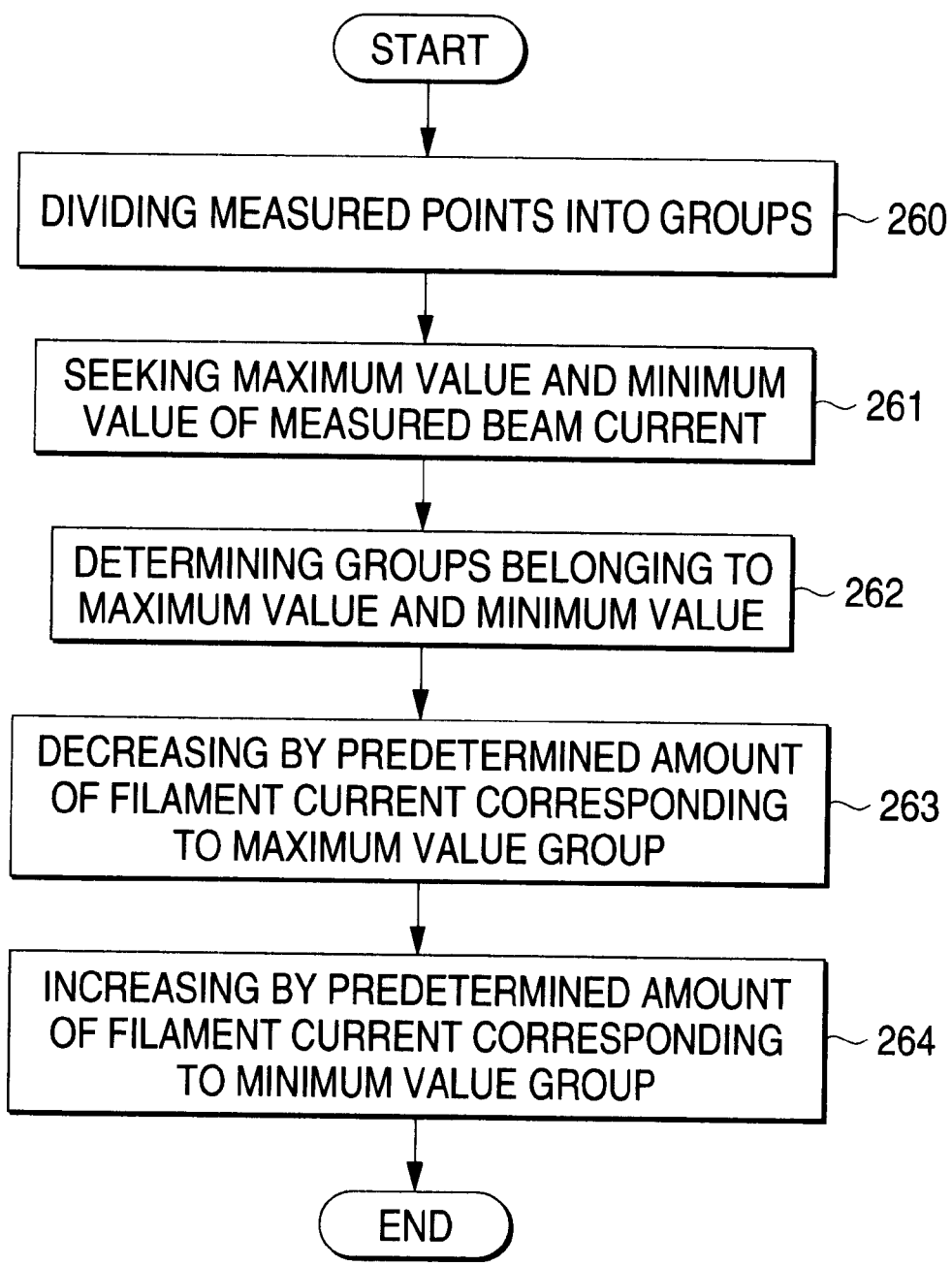
FIG. 19 is a flowchart showing one example of the uniformity control routine in the control apparatus of FIGS. 12 and 15.

To state this in detail, before scanning of the substrate holder 13, the current value control routine (Step 230) and the uniformity control routine (Step 231) are repeated at the predetermined time more than once similarly to the case of FIG. 17. One example of the current value control routine is as shown in FIG. 18 and one example of the uniformity control routine is as shown in FIG. 19, and overlapping explanation is omitted.

By the control before scanning, similarly to the prior art example, the beam current of the ion beam 12 brought out from the ion source 2 can be controlled at the predetermined value and the excellent uniformity as well.

The measured value (beam current IB) by the non-shielding beam current measuring instrument 24 immediately before scanning of the substrate holder 13 is stored as a target value (Step 233), and the substrate holder starts to scan.

During scanning of the substrate holder 13, whether or not the measured value by the non-shielding beam current instrument 24 is larger than the target value is judged (Step 235), and if larger, the operation goes to the Step 236 to decrease by the predetermined amount the filament current IF passing to all of the filaments 6. If not large, the operation goes to the Step 237 to judge whether or not the same is smaller than said target value, and if small, the operation goes to the Step 238 to increase by the predetermined amount the filament current IF passing to all of the filaments 6. The increasing or decreasing amounts are almost the same for all of the filaments 6 (including "the same"). By the increase and decrease of the filament current IF, the discharged electron amount from each of the filaments is increased or decreased, whereby the density of the plasmas 8 in the vicinity of the respective filaments 6 is increased or decreased, and the beam current of the ion beam 12 brought out from the range corresponding to the filaments 6 is increased or decreased.

The Steps 235 to 238 are processed until one reciprocal scanning of the substrate holder 13 is finished (Step 239).

By the control during scanning, while the substrate holder 13 is scanning, that is, during implanting ion to the substrate 14, the control is performed such that the measured value by the non-shielding beam current measuring instrument 24 comes near to the target value stored immediately before scanning of the substrate holder 13. Namely, also while the substrate holder 13 is interrupting the beam current measuring instrument 18, it is possible to control the current value of the ion beam 12 brought out from the ion source 2 at the predetermined value. Accordingly, the dose amount to the substrate 14 can be controlled more precisely than the prior art example.

The control before scanning and the control during scanning are performed per one reciprocal scanning of the substrate holder 13. Whether or not the substrate holder 13 is reciprocally scanned in the Step 40 till the predetermined times is judged, and if the reciprocal scanning of the predetermined time is accomplished, the control is finished, and if not yet accomplished, the operation returns to the current value control routine of the Step 30 so as to repeat the above control.

Although the uniformity of the ion beam 12 is not controlled during reciprocal scanning of the substrate holder 13, the lowering of the uniformity of the ion beam 12 for a short period of time can be ignored as mentioned above, no special trouble occurs. In addition, the uniformity control routine of the Step 31 is performed each time when the substrate holder 13 reciprocally scans, so that the uniformity of the ion beam 12 can be maintained excellent.

According to this ion source, the control before scanning and the control during scanning are performed each time when the substrate holder 13 reciprocally scans, so that it is possible to implant ion to the substrate 14 at the exact beam current value and with the ion beam 12 of the excellent uniformity.

Figure 14:
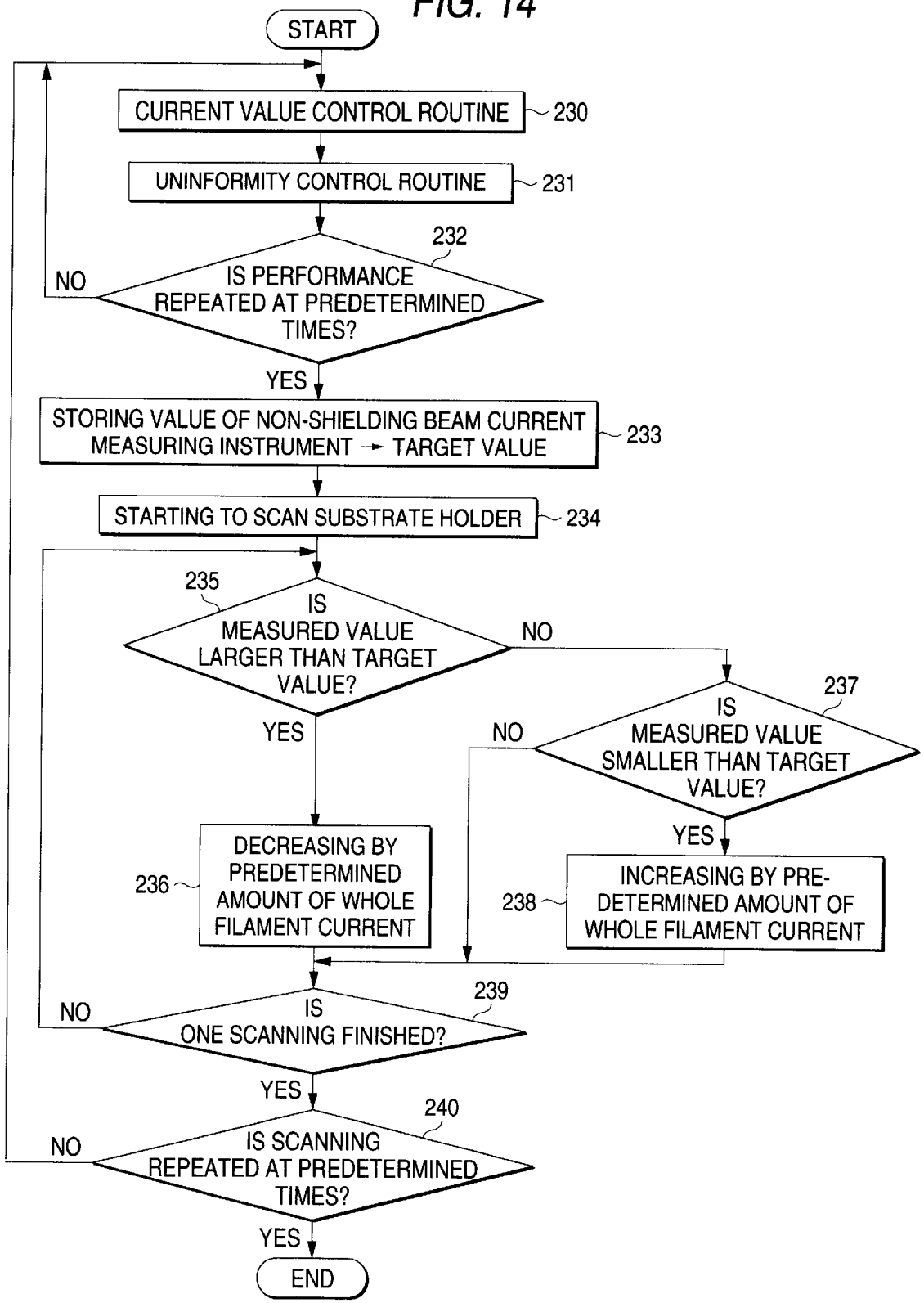
FIG. 14 is a flow chart showing one example of the control content by the control apparatus of FIG. 12.
Figure 15:
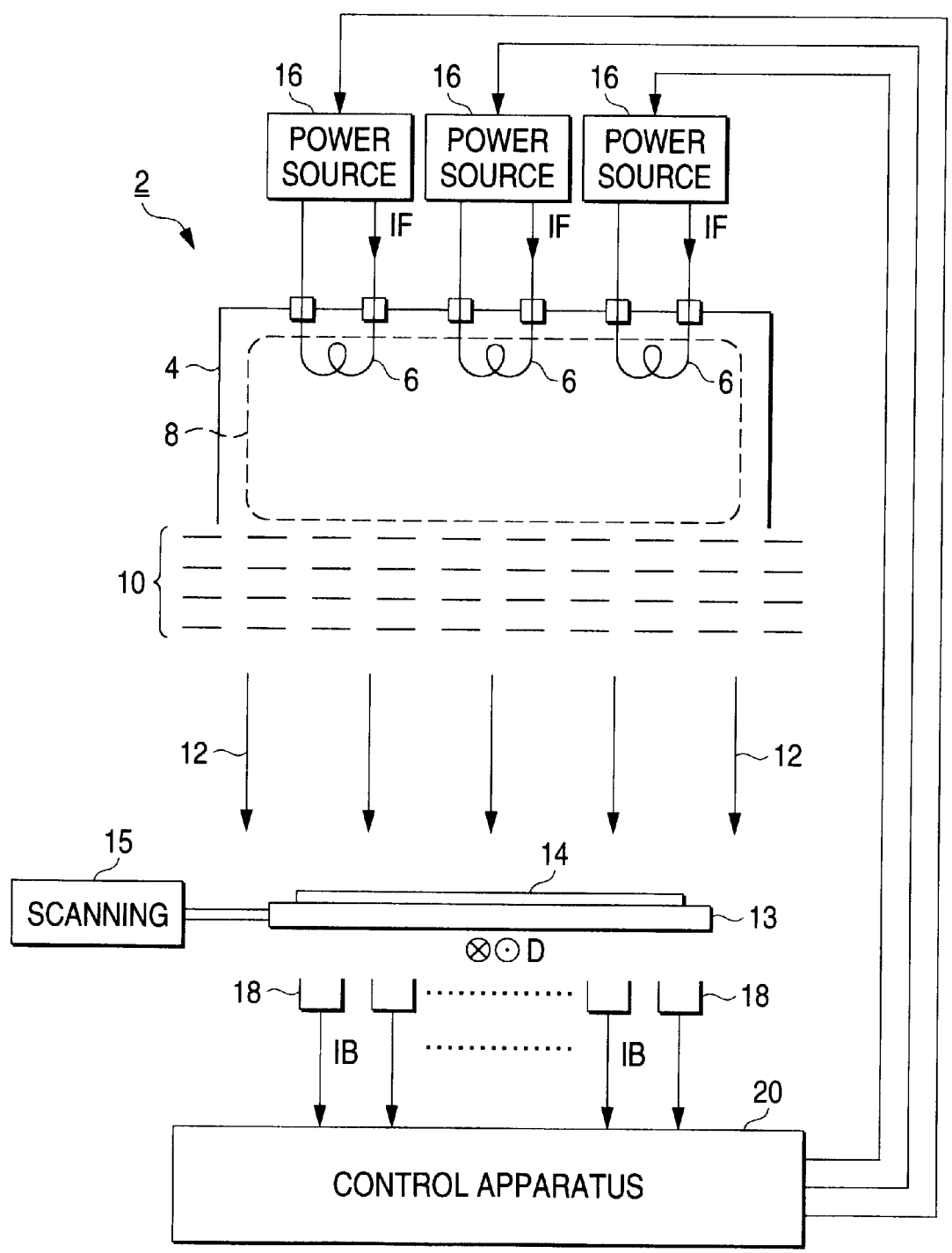
FIG. 15 is a view showing the preceding example of the ion implanting apparatus.
Figure 16:
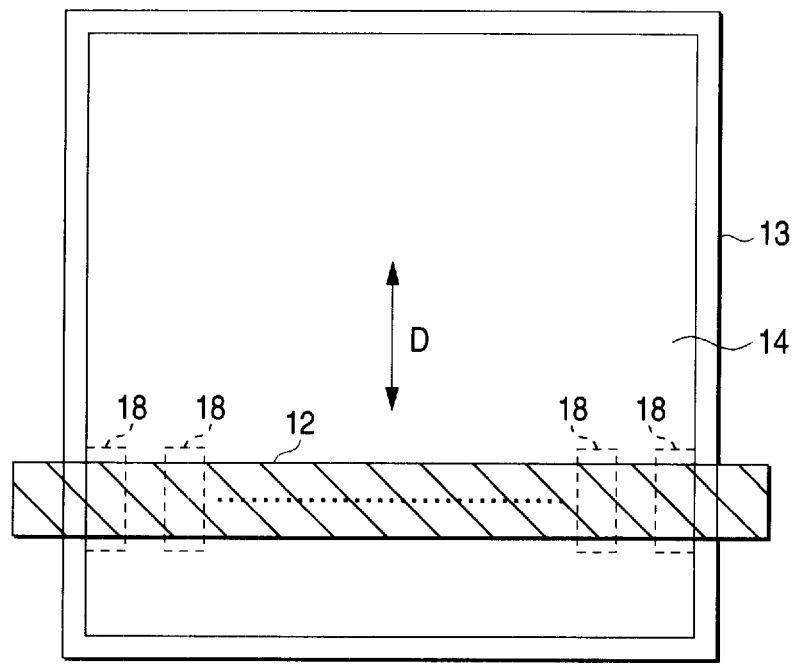
FIG. 16 is a plan view around the substrate holder of the apparatus of FIG. 15.
Figure 20:
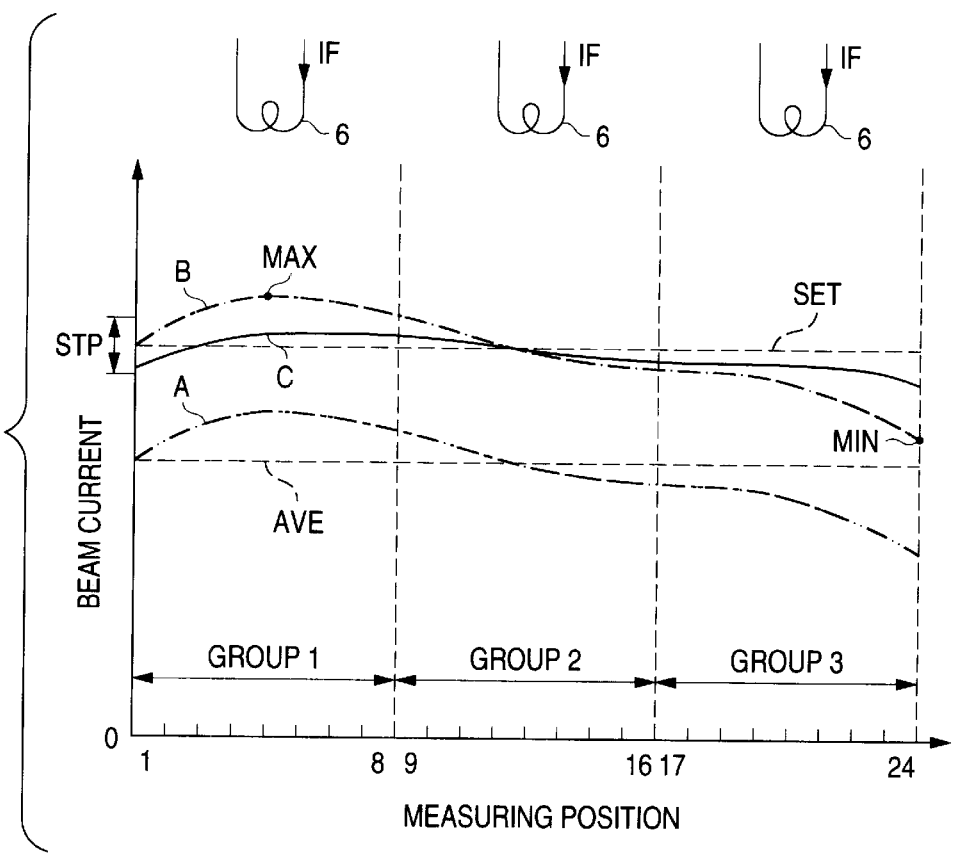
FIG. 20 is a view showing a schematic example of beam profile before and after the control.
Figure 21:
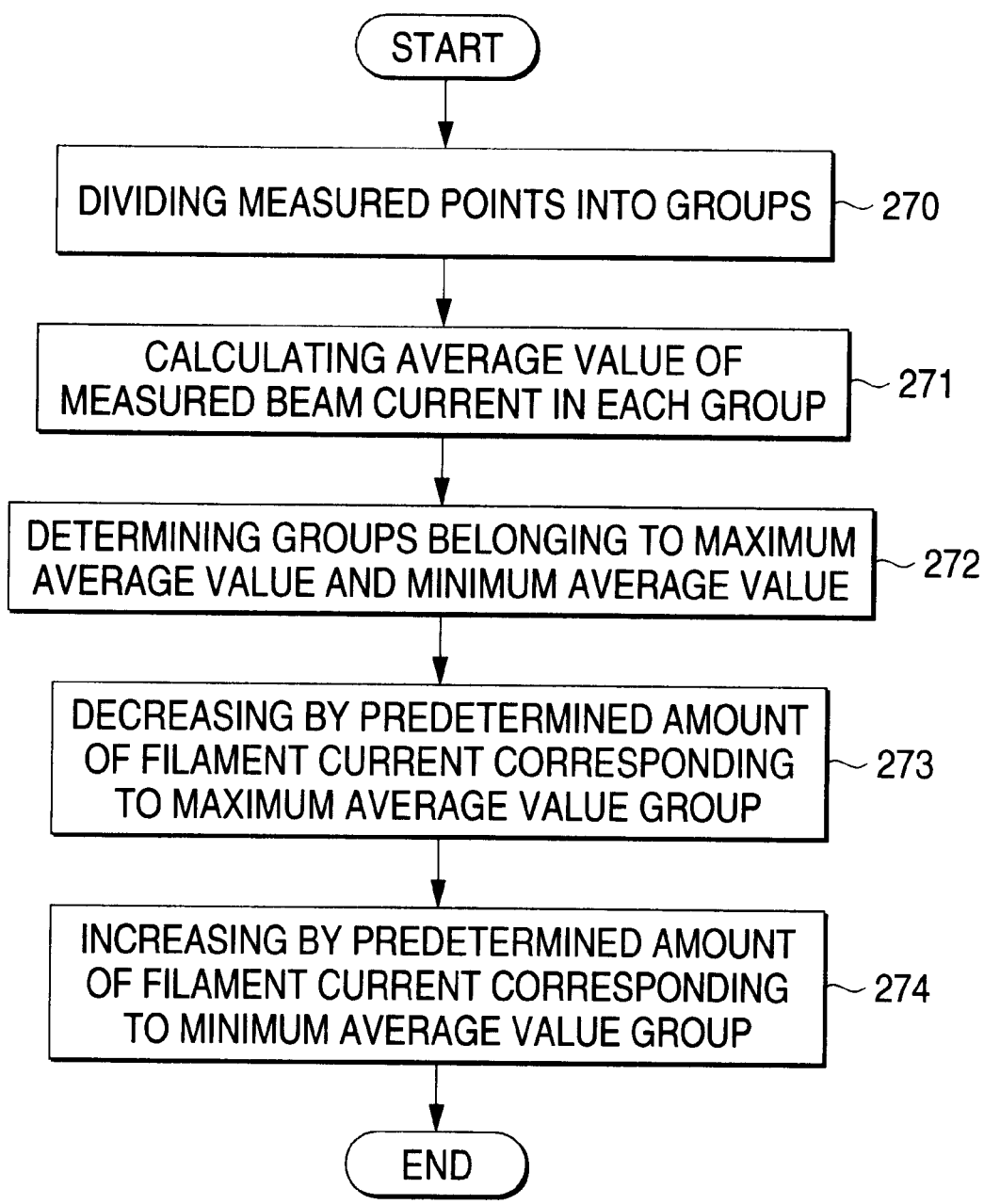
FIG. 21 is a flow chart showing another example of the uniformity control routine in the control apparatus of FIGS. 12 and 15.

The uniformity control routine in the Step 231 of FIG. 14 may be as shown in FIG. 21. This will be explained mainly in differences from FIG. 19. In the uniformity control routine of FIG. 21, the plurality of beam current measuring instruments 18 (measuring points) are grouped (Step 270) in the number of the filaments 6 (herein, three) similarly to the Step 260 of FIG. 19 so as to respectively calculate (Step 271) the average values of the measured beam current in the Groups 1 to 3, decide (Step 272) a group having a maximum average value (Group 1 in the example of FIG. 20) and a group having a minimum average value (Group 3 in the example of FIG. 20), decrease the filament current IF passing to the filament 6 corresponding to the group 1 having the maximum average value (Step 273) and increase the filament current IF passing to the filament 6 corresponding to the group 3 having the minimum average value (Step 274).

By employing such a uniformity control routine, even if a few of peculiar values or noises are included in the plurality of beam current measured values by the plurality of beam current measuring instruments 18, since the controls are performed in accordance with the average value per each of groups, beam current can be controlled by suppressing the peculiar values or noises to be low. In other words, if peculiar points or noises happen singly, the uniformity control routine prevents the whole control from being drawn thereby, so that the beam current of the whole ion beam can be exactly controlled.

The plurality of filament sources 16 are not necessarily independent, but it is allowed that they are united into one to provide one filament source which can supply the filament current IF independently to each of the filaments 6.

The number of the beam current measuring instruments 18 is, for example, multiplication of integer, i.e., the number of the filaments ×2 or more, but it may be not necessarily multiplication of integer. The number of the beam current measuring instruments 18 belonging to the respective groups is not necessarily the same number in each of the groups. It is sufficient to increase the number of the beam current measuring instruments 18 within the group which is desired to be more delicately controlled.

The control as the above mentioned example by the control apparatus 22 may, seeing it as a controlling method, be called as a control method of an ion implanting apparatus, a control method of an ion source, or a self control method of ion beam current.

What is claimed is:

1. An ion implanting apparatus comprising
an ion source having a plurality of filaments;
one or more of filament sources for independently passing filament current to the respective filaments of the ion source;
a plurality of beam current measuring instruments for measuring beam current of ion beam brought out from the ion source at a plurality of positions in planes crossing with the ion beam, the number of said beam current measuring instruments being more than the number of the filaments; and
a control apparatus which controls filament current passing to the respective filaments from the filament sources in accordance with beam current measured by the beam current measuring instruments, and performs a current value control routine and a uniformity control routine of the beam current at least once respectively;
wherein said current value control routine calculates the average values of all beam current measured by the plurality of beam current measuring instruments, and increases and decreases the filament current passing to said respective filaments by almost the same amount one another such that the average value comes near to the set value, and
said uniformity control routine groups the plurality of beam current measuring instruments into the number of the filaments, seeks for a maximum value and a minimum value from all measured values by all beam current measuring instruments so as to respectively decide the groups to which the maximum value and the minimum value belong, decreases the filament current passing to the filament corresponding to the group to which the maximum value belongs and increases the filament current passing to the filament corresponding to the group to which the minimum value belongs.

2. An ion implanting apparatus comprising:
an ion source having a plurality of filaments;
one or more of filament sources for independently passing filament current to the respective filaments of the ion source;
a plurality of beam current measuring instruments for measuring beam current of ion beam brought out from the ion source at a plurality of positions in planes crossing with the ion beam, the number of said beam current measuring instrument being more than the number of the filaments; and
a control apparatus which controls filament current passing to the respective filaments from the filament sources in accordance with beam current measured by the beam current measuring instruments, and performs a current value control routine and a uniformity control routine of the beam current at least once respectively;
wherein said current value control routine increases and decreases the filament current passing to the respective filaments such that the beam current measured by the plurality of beam current measuring instruments comes near to the set value, and
said uniformity control routine groups said plurality of beam current measuring instruments into the number of the filaments, seeks for a maximum value and a minimum value from all measured values by all beam current measuring instruments so as to respectively decide groups to which the maximum value and minimum value belong, decreases the filament current passing to the filament corresponding to the group to which the maximum value belongs and increases the filament current passing to the filament corresponding to the group to which the minimum value belongs, and said control apparatus, in the uniformity control routine, demandes the difference between the maximum value and the minimum value, groups the dimension in the difference into a plurality of steps, and controls to differ the amount of increasing and decreasing the filament current in accordance with each of said steps.

3. An ion implanting apparatus comprising:

an ion source having a plurality of filaments; one or more of filament sources for independently passing filament current to the respective filaments of the ion source; a plurality of beam current measuring instruments for measuring beam current of ion beam brought out from the ion source at a plurality of positions in planes crossing with the ion beam, the number of said beam current measuring instrument being more than the number of the filaments;

a control apparatus which controls filament current passing to the respective filaments from the filament source in accordance with beam current measured by the beam current measuring instruments, and performs a current value control routine and a uniformity control routine of the beam current at least once respectively;

wherein said current value control routine increases and decreases the filament current passing to the respective filaments such that the beam current measured by the plurality of beam current measuring instruments comes near to the set value, said uniformity control routine groups said plurality of beam current measuring instruments into the number of the filaments, seeks for a maximum value and a minimum value from all measured values by all beam current measuring instruments so as to respectively decide groups to which the maximum value and minimum value belong, decreases the filament current passing to the filament corresponding to the group to which the maximum value belongs and increases the filament current passing to the filament corresponding to the group to which the minimum value belongs, and the control apparatus, in the uniformity routine, prohibits the increasing actuation of the filament current passing to the filaments corresponding to the group to which the minimum value belongs, when the average values of all beam current measured by the plurality of beam current measuring instruments are placed within a predetermined stopping range with respect to the set value and this average value is larger than this set value, and prohibits the decreasing actuation of the filament current passing to the filaments corresponding to the group to which the maximum value belongs, when the average value is smaller than the set value.

4. An ion implanting apparatus comprising:

an ion source having a plurality of filaments;

one or more of filament sources for independently passing filament current to the respective filaments of the ion source;

a plurality of beam current measuring instruments for measuring beam current of ion beam brought out from the ion source at a plurality of positions in planes crossing with the ion beam, the number of said beam current measuring instrument being more than the number of the filaments;

a control apparatus which controls filament current passing to the respective filaments from the filament sources in accordance with beam current measured by the beam current measuring instruments, and performs a current value control routine and a uniformity control routine of the beam current at least once respectively;

wherein said current value control routine calculates the average value of all beam current measured by the plurality of beam current measuring instruments, and increases and decreases the filament current passing to said respective filaments by almost the same amount one another such that the average value comes near to the set value; and said uniformity control routine groups the plurality of beam current measuring instruments into the number of the filaments, calculates the average value of the measured beam current within the respective groups, decides groups having the maximum average value and the minimum average value, decreases the filament current passing to the filament corresponding to the group having the maximum average value, and increases the filament current passing to the filament corresponding to the group having the minimum average value.

5. An ion implanting apparatus comprising:

an ion source having a plurality of filaments; one or more of filament sources for independently passing filament current to the respective filaments of the ion source;

a plurality of beam current measuring instruments for measuring beam current of ion beam brought out from the ion source at a plurality of positions in planes crossing with the ion beam, the number of said beam current measuring instrument being more than the number of the filaments;

a control apparatus which controls filament current passing to the respective filaments from the filament source in accordance with beam current measured by the beam current measuring instruments, and performs a current value control routine and a uniform uniformity control unit of the beam current at least once respectively;

wherein said current value control routine increases and decreases the filament current passing to the respective filaments such that the beam current measured by the plurality of beam current measuring instruments comes near to the set value;

said uniformity control routine groups the plurality of beam current measuring instruments into the number of the filaments, calculates the average value of the measured beam current within the respective groups, decides groups having the maximum average value and the minimum average value, decreases the filament current passing to the filament corresponding to the group having the maximum average value, and increases the filament current passing to the filament corresponding to the group having the minimum average value; and said control apparatus, in the uniformity control routine, demands the difference between the maximum average value and the minimum average value, divides dimensions in the difference into a plurality of steps, and controls to differ the amounts of increasing and decreasing the filament current in response to each of the steps.

6. An ion implanting apparatus comprising:

an ion source having a plurality of filaments;

one or more of filament sources for independently passing filament current to the respective filaments of the ion source;

a plurality of beam current measuring instruments for measuring beam current of ion beam brought out from the ion source at a plurality of positions in planes crossing with the ion beam, the number of said beam current measuring instrument being more than the number of the filaments; and a control apparatus which controls filament current passing to the respective filaments from the filament sources in accordance with beam current measured by the beam current measuring instruments, and performs a current value control routine and a uniformity control routine of the beam current at least once respectively;

wherein said current value control routine increases and decreases the filament current passing to the respective filaments such that the beam current measured by the plurality of beam current measuring instruments comes near to the set value;

said uniformity control routine groups the plurality of beam current measuring instruments into the number of the filaments, calculates the average value of the measured beam current within the respective groups, decides groups having the maximum average value and the minimum average value, decreases the filament current passing to the filament corresponding to the group having the maximum average value, and increases the filament current passing to the filament corresponding to the group having the minimum average value; and the control apparatus, in the uniformity routine, prohibits the increasing actuation of the filament current passing to the filament corresponding to the group to which the minimum value belongs, when the average value of all beam current measured by the plurality of beam current measuring instruments is placed within a predetermined stopping range with respect to the set value and this average value is larger than this set value, and prohibits the decreasing actuation of the filament current passing to the filament corresponding to the group to which the maximum value belongs, when the average value is smaller than the set value.

7. An ion implanting apparatus comprising:

an ion source having a plurality of filaments; one or more of filament sources for independently passing filament current to the respective filaments of the ion source;

a plurality of beam current measuring instruments for measuring beam current of ion beam brought out from the ion source at a plurality of positions in planes crossing with the ion beam, the number of said beam current measuring instrument being more than the number of the filaments; and a control apparatus which controls filament current passing to the respective filaments from the filament source in accordance with beam current measured by the beam current measuring instruments, and performs a current value control routine and a uniformity control routine of the beam current at least once respectively;

wherein said current value control routine calculates the average value of all beam current measured by the plurality of beam current measuring instruments, and increases and decreases the filament current passing to said respective filaments by almost the same amount one another such that the average value comes near to the set value; and said uniformity control routine groups the plurality of beam current measuring instruments into the number of the filaments, calculates the average value of the measured beam current within the respective groups, decides one group having the largest difference for the set value, decreases the filament current passing to the filaments corresponding to said group when the average value of this group is larger than said set value, and increases the filament current passing to the filaments corresponding to said group when the average value of this group is smaller than said set value.

8. An ion implanting apparatus comprising:

an ion source having a plurality of filaments;

one or more of filament sources for independently passing filament current to the respective filaments of the ion source;

a plurality of beam current measuring instruments for measuring beam current of ion beam brought out from the ion source at a plurality of positions in planes crossing with the ion beam, the number of said beam current measuring instrument being more than the number of the filaments;

a control apparatus which controls filament current passing to the respective filaments from the filament sources in accordance with beam current measured by the beam current measuring instruments, and performs a current value control routine and a uniformity control routine of the beam current at least once respectively;

wherein said current value control increases and decreases the filament current passing to the respective filaments such that the beam current measured by the plurality of beam current measuring instruments comes near to the set value;

said uniformity control routine groups the plurality of beam current measuring instruments into the number of the filaments, calculating the average value of the measured beam current within the respective groups, decides one group having the largest difference for the set value, decreases the filament current passing to the filaments corresponding to said group when the average value of this group is larger than said set value, and increases the filament current passing to the filaments corresponding to said group when the average value of this group is smaller than said set value; and said control apparatus, in the uniformity control routine, demandes the difference between the set value and the average value of the decided group, divids dimensions in the difference into a plurality of steps, and controls to differ the amounts of increasing and decreasing the filament current in response to each of the steps.

9. An ion implanting apparatus comprising:

an ion source having a plurality of filaments;

one or more of filament sources for independently passing filament current to the respective filaments of the ion source;

a substrate holder for holding a substrate to which ion is implanted;

a holder scanning mechanism for reciprocally scanning the substrate holder within a range of irradiating ion beam brought out from the ion source;

a plurality of beam current measuring instruments for measuring beam current of ion beam brought out from the ion source at a plurality of positions in the downstream of the scanning range of the substrate holder, the number of said beam current measuring instrument being more than the number of the filaments;

a control apparatus which controls filament current passing to the respective filaments from the filament sources in accordance with beam current measured by the beam current measuring instruments, and performs a current value control routine and a uniformity control routine of the beam current at least once respectively; said current value control routine calculating the average value of all beam current measured by the plurality of beam current measuring instruments, and increasing and decreasing the filament current passing to said respective filaments by almost the same amount one another such that the average value comes near to the set value, said uniformity control routine grouping the plurality of beam current measuring instruments into the number of the filaments, increasing and decreasing the filament current passing to the filaments corresponding to the respective groups, a non-shielding beam current measuring instrument which receives ion beam brought out from the ion source so as to measure the beam current, and which is disposed outside of the scanning range of the substrate holder and is not shielded by the scanning substrate holder;

wherein said control apparatus performs the control before scanning and the control during scanning per one reciprocal scanning of the substrate holder; said control before scanning repeates at predetermined times the current value control routine and the uniformity control routine before starting to scan the substrate holder; and said control during scanning stores as a target value the measured value by the non-shielding beam current measuring instrument immediately before scanning of the substrate holder, and increases and decreases by almost the same amount one another the filament current passing to the respective filaments such that the measured value by the non-shielding beam current measuring instrument comes neat to the target value.

* * * * *

UNITED STATES PATENT AND TRADEMARK OFFICE
CERTIFICATE OF CORRECTION

PATENT NO.     : 6,555,831 B1
DATED          : April 29, 2003
INVENTOR(S)    : Masashi Konishi et al.

It is certified that error appears in the above-identified patent and that said Letters Patent is hereby corrected as shown below:

Column 19,
Line 6, "demandes" should read -- demands --.

Column 20,
Line 38, before "uniformity", delete "uniform".
Line 39, "unit" should read -- routine --.

Column 22,
Line 46, "demandes" should read -- demands --.
Line 47, "divids" should read -- divides --.

Column 24,
Line 7, "repeates" should read -- repeats --.
Line 17, "neat" should read -- near --.

Signed and Sealed this

Sixteenth Day of December, 2003

JAMES E. ROGAN
*Director of the United States Patent and Trademark Office*